United States Patent
Kim et al.

(10) Patent No.: US 12,062,739 B2
(45) Date of Patent: Aug. 13, 2024

(54) DISPLAY DEVICE AND MANUFACTURING METHOD THEREFOR

(71) Applicant: Samsung Display Co., LTD., Yongin-si (KR)

(72) Inventors: Dae Hyun Kim, Hwaseong-si (KR); Hyun Min Cho, Seoul (KR); Jin Oh Kwag, Yongin-si (KR); Keun Kyu Song, Seongnam-si (KR); Sung Chan Jo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 716 days.

(21) Appl. No.: 17/257,756

(22) PCT Filed: Jan. 3, 2019

(86) PCT No.: PCT/KR2019/000110
§ 371 (c)(1),
(2) Date: Jan. 4, 2021

(87) PCT Pub. No.: WO2020/022593
PCT Pub. Date: Jan. 30, 2020

(65) Prior Publication Data
US 2021/0280746 A1   Sep. 9, 2021

(30) Foreign Application Priority Data
Jul. 24, 2018  (KR) ......................... 10-2018-0086143

(51) Int. Cl.
*H01L 33/38* (2010.01)
*H01L 27/15* (2006.01)
*H01L 33/00* (2010.01)

(52) U.S. Cl.
CPC .......... *H01L 33/382* (2013.01); *H01L 27/156* (2013.01); *H01L 33/005* (2013.01); *H01L 2933/0016* (2013.01)

(58) Field of Classification Search
CPC ................. H01L 27/156; H01L 33/005; H01L 2933/0016; H01L 25/167; H01L 25/0753;
(Continued)

(56) References Cited

U.S. PATENT DOCUMENTS

| 2011/0089850 A1 | 4/2011 | Shibata et al. |
| 2011/0254043 A1 | 10/2011 | Negishi et al. |

(Continued)

FOREIGN PATENT DOCUMENTS

| CN | 102842509 | 12/2012 |
| CN | 107611153 | 1/2018 |

(Continued)

OTHER PUBLICATIONS

Extended European search report for European Patent Application or Patent No. 19841777.6 dated Apr. 19, 2022.
(Continued)

*Primary Examiner* — Moin M Rahman
(74) *Attorney, Agent, or Firm* — KILE PARK REED & HOUTTEMAN PLLC

(57) ABSTRACT

A display device includes a first electrode, a second electrode spaced apart from the first electrode to face the first electrode, a first insulation layer, at least one light emitting element, a second insulation layer, a first contact electrode, and a second contact electrode. The first insulation layer includes an overlapping area which overlaps the at least one light emitting element, a first non-overlapping area which extends outward from the first end of the at least one light emitting element and does not overlap the at least one light emitting element, and a second non-overlapping area which
(Continued)

extends outward from the second end of the at least one light emitting element and does not overlap the at least one light emitting element.

14 Claims, 25 Drawing Sheets

(58) Field of Classification Search
CPC ... H01L 33/0095; H01L 2933/00–0091; H01L 27/15–156; H01L 33/00–648; H01L 25/048; H01L 27/14–14893; H01L 31/45–153; H01L 31/165–173; H01L 25/075–0756; H01L 25/13; H01L 25/16–167; H01L 33/52–56; H01L 51/448; H01L 51/5209; H01L 27/3262; H01L 27/3248; H01L 51/5225; H01L 51/5268; H01L 2251/558; H01L 2251/303; H01L 2251/306; H01L 2251/308; H01L 51/5218; H01L 51/5275; H01L 27/3258; H01L 27/322; H01L 51/0005; H01L 51/5012; H01L 51/5206; H01L 51/5221; H01L 51/5271; H01L 51/56; H01L 27/3244; H01L 2227/323; H01L 33/20; H01L 51/00; H01L 33/58; H01L 27/1248; H01L 33/505; H01L 29/78633; H01L 51/5262; H10K 50/14; H10K 50/155; H10K 50/156; H10K 50/10–135; H10K 50/401–828; H10K 50/15–157

See application file for complete search history.

(56) References Cited

U.S. PATENT DOCUMENTS

| | | | |
|---|---|---|---|
| 2013/0027623 A1 | 1/2013 | Negishi et al. | |
| 2014/0145237 A1 | 5/2014 | Do et al. | |
| 2018/0019369 A1* | 1/2018 | Cho | ............ H01L 27/156 |
| 2018/0175009 A1 | 6/2018 | Kim et al. | |
| 2018/0175106 A1* | 6/2018 | Kim | ............ H01L 33/385 |

FOREIGN PATENT DOCUMENTS

| | | |
|---|---|---|
| CN | 112385045 | 2/2021 |
| EP | 3 270 424 | 1/2018 |
| JP | 2012-4535 | 1/2012 |
| KR | 10-2012-0122159 | 11/2012 |
| KR | 10-1436123 | 11/2014 |
| KR | 10-2015-0006798 | 1/2015 |
| KR | 10-2015-0013708 | 2/2015 |
| KR | 10-2016-0059574 | 5/2016 |
| KR | 10-2016-0059576 | 5/2016 |
| KR | 10-2017-0083191 | 7/2017 |
| KR | 10-2018-0009014 | 1/2018 |
| KR | 10-2018-0071465 | 6/2018 |
| KR | 10-2018-0072909 | 7/2018 |

OTHER PUBLICATIONS

Written Opinion, with English translation, corresponding to International Application No. PCT/KR2019/000110, dated Apr. 23, 2019.

International Search report, with English translation, corresponding to International Application No. PCT/KR2019/000110, dated Apr. 23, 2019.

* cited by examiner

DISPLAY DEVICE AND MANUFACTURING METHOD THEREFOR

CROSS-REFERENCE TO RELATED APPLICATIONS

This application is a national entry of International Application No. PCT/KR2019/000110, filed on Jan. 3, 2019, which claims under 35 U.S.C. § 119(a) and 365(b) priority to and benefits of Korean Patent Application No. 10-2018-0086143, filed on Jul. 24, 2018 in the Korean Intellectual Property Office, the entire contents of all of which are incorporated herein by reference.

BACKGROUND

The present disclosure relates to a display device and a manufacturing method therefor.

Display devices have become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

SUMMARY

Aspects of the present disclosure provide a display device without an air gap that may be formed under a light emitting element by forming inorganic insulation layer patterns having different etch selectivities on an inorganic insulation layer.

An objective of the present disclosure is to prevent breaking or poor contact of a contact electrode in case that a light emitting element contacts the contact electrode. It should be noted that aspects of the present disclosure are not limited to the above-mentioned aspects, and other unmentioned aspects of the present disclosure will be clearly understood by those skilled in the art from the following descriptions.

According to an aspect of the present disclosure, a display device may comprise a first electrode, a second electrode spaced apart from the first electrode to face the first electrode; a first insulation layer disposed on the first electrode and the second electrode to expose at least a portion of each of the first electrode and the second electrode and to cover at least a portion of respective facing sides of the first electrode and the second electrode and a space between the first electrode and the second electrode; at least one light emitting element disposed on the first insulation layer between the first electrode and the second electrode, a second insulation layer disposed between the first electrode and the second electrode to cover at least a portion of the at least one light emitting element; a first contact electrode electrically contacting the first electrode and a first end of the at least one light emitting element; and a second contact electrode electrically contacting the second electrode and a second end of the at least one light emitting element. The first insulation layer may comprise an overlapping area overlapping the at least one light emitting element; a first non-overlapping area extending outward from the first end of the at least one light emitting element and not overlapping the at least one light emitting element; and a second non-overlapping area extending outward from the second end of the at least one light emitting element and not overlapping the at least one light emitting element.

The first insulation layer partially may cover the first electrode and the second electrode and may comprise a first opening partially exposing the first electrode and a second opening partially exposing the second electrode.

A material of the first insulation layer and a material of the second insulation layer may have different etch selectivities.

The first insulation layer may partially cover sides opposite the respective facing sides of the first electrode and the second electrode.

The overlapping area of the first insulation layer may be substantially level with at least a portion of each of the first non-overlapping area and the second non-overlapping area.

The respective facing sides of the first electrode and the second electrode may be inclined with respect to a substrate disposed under the first electrode and the second electrode, at least a portion of the first non-overlapping area may partially overlap the inclined side of the first electrode, and at least a portion of the second non-overlapping area may partially overlap the inclined side of the second electrode.

The first non-overlapping area may partially cover an upper surface of the first electrode, and the second non-overlapping area may partially cover an upper surface of the second electrode.

At least one of the first opening and the second opening may extend in a first direction in which the first electrode and the second electrode extend, and the first opening and the second opening may be spaced apart from each other in a second direction different from the first direction.

Both ends of each of the first opening and the second opening in the first direction may end at positions spaced apart inwardly from both ends of the first electrode or the second electrode in the first direction.

A width of the first opening and a width of the second opening measured in the second direction may be smaller than a width of the first electrode and a width of the second electrode measured in the second direction, respectively, and a distance between the respective facing sides of the first electrode and the second electrode may be smaller than a distance between respective facing sides of the first opening and the second opening.

A length between the first end and the second end of the at least one light emitting element may be greater than the distance between the respective facing sides of the first electrode and the second electrode and smaller than the distance between the respective facing sides of the first opening and the second opening.

The first contact electrode may electrically contact the first electrode through the first opening, the second contact electrode may electrically contact the second electrode through the second opening, and at least a portion of each of the first contact electrode and the second contact electrode contacts the first insulation layer.

A side surface of the first end of the at least one light emitting element may electrically contact the first contact electrode, a side surface of the second end of the at least one light emitting element may electrically contact the second contact electrode, and lower surfaces of the first end and the second end of the at least one light emitting element may partially contact the overlapping area of the first insulation layer.

The display device may further comprise a third insulation layer disposed on the first electrode, the first contact electrode, and the second insulation layer to partially cover the first electrode, the first contact electrode and the second insulation layer. The second contact electrode may contact at least a portion of each of the third insulation layer, the second electrode, and the second insulation layer.

According to an aspect of the present disclosure, a method of manufacturing a display device may comprise forming a first electrode, a second electrode facing the first electrode on a substrate; forming a first insulation layer on the first electrode and the second electrode and between the first electrode and the second electrode; forming a light emitting element on the first insulation layer; forming a second insulation layer to cover the light emitting element and patterning a portion of the first insulation layer to expose a first end of the light emitting element; forming a first opening to expose the first electrode by partially patterning an area where the first electrode and the first insulation layer overlap; and forming a first contact electrode electrically contacting the exposed first end of the light emitting element and the first electrode exposed by the opening.

A material of the first insulation layer and a material of the second insulation layer may have different etch selectivities, and the patterning of the second insulation layer includes refraining from patterning the first insulation layer.

The forming of the first opening may include forming the first opening to have a width smaller than a width of the first electrode.

The method may comprise patterning the second insulation layer to expose a second end opposite the first end of the light emitting element; forming a second opening to expose the second electrode by partially patterning an area where the second electrode and the first insulation layer overlap; and forming a second contact electrode electrically contacting the exposed second end of the light emitting element and the second electrode exposed by the second opening.

The forming of the first insulation layer may comprise forming an overlapping area overlapping the light emitting element; forming a first non-overlapping area extending outward from the first end of the light emitting element and not overlapping the light emitting element; and forming a second non-overlapping area extending outward from the second end of the light emitting element and not overlapping the light emitting element.

The forming of the overlapping area of the first insulation layer may include forming the overlapping area of the first insulation layer to be substantially level with at least a portion of each of the first non-overlapping area and the second non-overlapping area.

The details of other embodiments are included in the detailed description and the drawings.

In a display device according to an embodiment, lower surfaces of both ends of a light emitting element may form a smooth contact with a first insulation layer including an inorganic material, and both ends of the light emitting element may form a smooth contact with contact electrodes which contact side surfaces of the both ends. Accordingly, it is possible to prevent the formation of an air gap under the light emitting element in a patterning process performed after the light emitting element is aligned and possible to prevent breaking and short-circuit problems of the contact electrode material.

Advantageous effects according to the present disclosure are not limited to those mentioned above, and various other advantageous effects are included herein.

BRIEF DESCRIPTION OF THE DRAWING

An additional appreciation according to the embodiments of the invention will become more apparent by describing in detail the embodiments thereof with reference to the accompanying drawings, wherein.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments of the present disclosure will be described with reference to the accompanying drawings.

Figure 1:
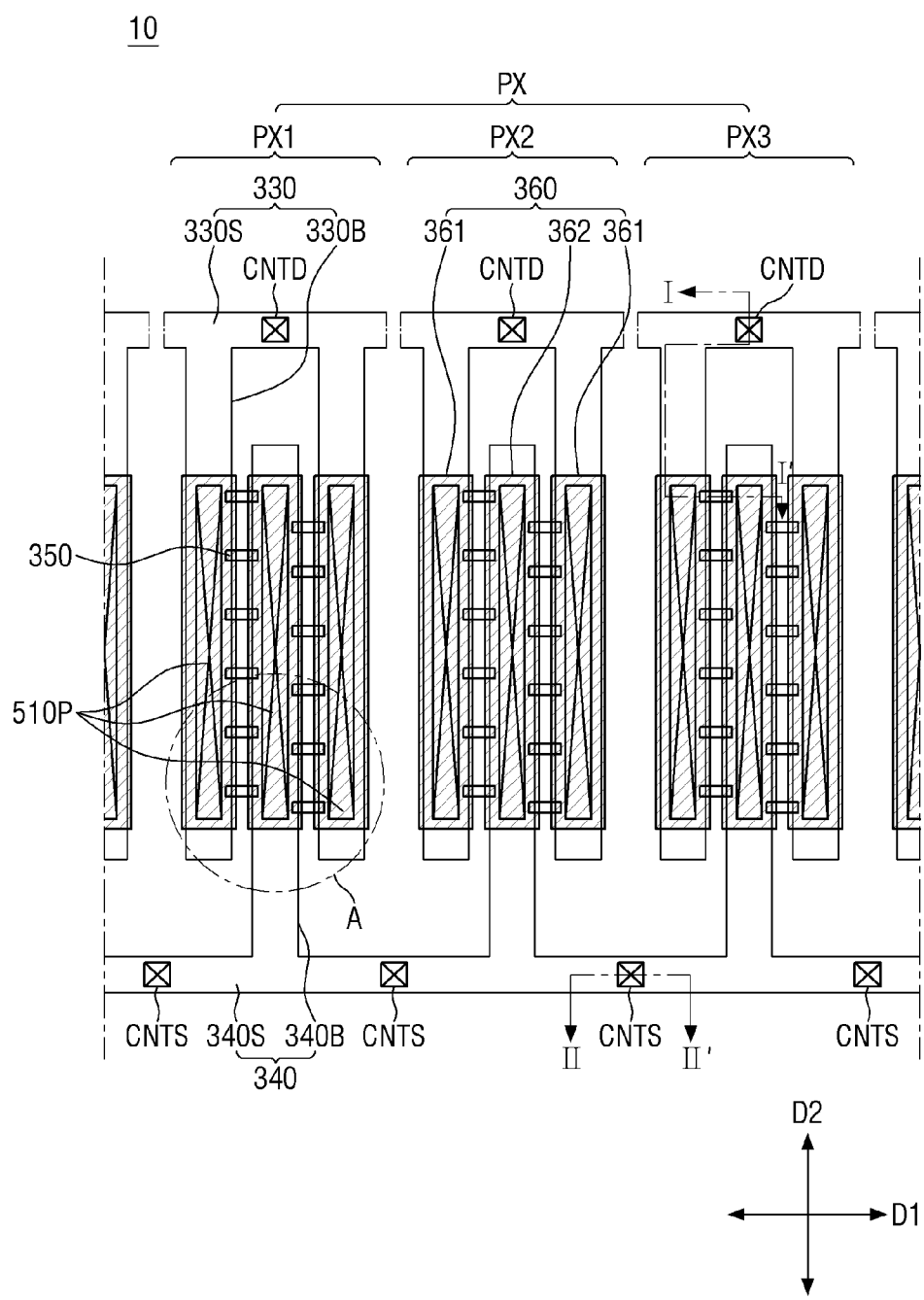
FIG. 1 is a schematic plan view of a display device according to an embodiment.

FIG. 1 is a schematic plan view of a display device according to an embodiment.

The display device 10 may include at least one area defined as a pixel PX. Pixels PX may be disposed in a display portion of the display device 10 and may each emit light of a specific wavelength band to the outside of the display device 10. Although three pixels PX1 through PX3 are illustrated in FIG. 1 by way of example, it is apparent that the display device 10 may include a larger number of pixels. Although pixels PX disposed only in one direction, e.g., a first direction D1 in cross section are illustrated in the drawing, pixels PX may also be disposed in a second direction D2 intersecting the first direction D1. Each pixel PX of FIG. 1 may also be divided into segments, each forming one pixel PX. The pixels may not necessarily be disposed in parallel in the first direction D1 as illustrated in FIG. 1 but may also be disposed in various structures such as in a vertical direction (or the second direction D2) and in a zigzag manner.

Although not illustrated in the drawing, the display device 10 may include an emission portion, in which light emitting elements 350 are disposed to display light of a specific color, and a non-emission portion, which is defined as an area other than the emission part. The non-emission portion may be covered by specific members so that it is not visible from the outside of the display device 10. In the non-emission part, various members for driving the light emitting elements 350 disposed in the emission portion may be disposed. For example, wirings, a circuit unit, and a driving unit for transmitting electrical signals to the emission portion may be disposed in the non-emission part, but the present disclosure is not limited thereto.

The pixels PX may display colors by including one or more light emitting elements 350 emitting light of a specific wavelength band. Light emitted from the light emitting elements 350 may be displayed externally through the emission portion of the display device 10. In an embodiment, pixels PX displaying different colors may include light emitting elements 350 emitting light of different colors. For example, a first pixel PX1 displaying red color may include light emitting elements 350 emitting red light, a second pixel PX2 displaying green color may include light emitting elements 350 emitting green light, and a third pixel PX3 displaying blue color may include light emitting elements 350 emitting blue light. However, the present disclosure is not limited thereto. In some cases, pixels displaying different colors may include light emitting elements 350 emitting light of the same color (e.g., blue), and a wavelength conversion layer or a color filter may be placed on an emission path to realize the color of each pixel. However, the present disclosure is not limited thereto. In some cases, adjacent pixels PX may emit light of the same color.

Referring to FIG. 1, the display device 10 may include electrodes 330 and 340, openings 510P of a first insulation layer 510 (see, e.g., FIG. 3) disposed on the electrodes 330 and 340, and light emitting elements 350. At least a portion of each of the electrodes 330 and 340 may be disposed in each pixel PX and electrically connected to the light emitting elements 350 and may transmit an electrical signal to the light emitting elements 350 so that the light emitting elements 350 can emit light of a specific color.

At least a portion of each of the electrodes 330 and 340 may be utilized to form an electric field in each pixel PX in order to align the light emitting elements 350. Specifically, in case that the light emitting elements 350 emitting light of different colors are aligned in pixels PX, it is necessary to accurately align the different light emitting elements 350 in each pixel PX. In order to align the light emitting elements 350 using a dielectrophoresis (DEP) method, a solution containing the light emitting elements 350 may be applied to the display device 10, and then alternating current (AC) power may be applied to form capacitance due to an electric field. Accordingly, a DEP force may be applied to the light emitting elements 350, thereby aligning the light emitting elements 350.

Here, the first insulation layer 510 may be disposed on each electrode 330 or 340 to cover each electrode 330 or 340 but to expose a portion of each electrode 330 or 340 through an opening 510P, and the light emitting elements 350 may be disposed on the first insulation layer 510 and spaced apart from the opening 510P. The first insulation layer 510 may form a smooth contact surface with each light emitting element 350 without its area in contact with a lower surface of each light emitting element 350 being damaged or its material being etched. The contact surface of the first insulation layer 510 may extend horizontally toward each electrode 330 or 340. Contact electrodes 360 may smoothly contact side surfaces of both ends of each light emitting element 350 on the first insulation layer 510. Since the contact electrodes 360 may contact the first electrode 330 and the second electrode 340 exposed in the openings 510P, they may transmit electrical signals received respectively from the electrodes 330 and 340 to the light emitting elements 350. This will be described in more detail below.

Each of the electrodes 330 and 340 may include a first electrode 330 and a second electrode 340. In an exemplary embodiment, the first electrode 330 may be a separate pixel electrode disposed in each pixel PX, and the second electrode 340 may be a common electrode commonly connected along pixels PX. The first electrode 330 may be an anode of each light emitting element 350, and the second electrode 340 may be a cathode of each light emitting element 350. However, the present disclosure is not limited thereto, and the opposite may also be the case.

Each of the first electrode 330 and the second electrode 340 may include an electrode stem 330S or 340S extending in the first direction D1 and at least one electrode branch 330B or 340B extending and branching from the electrode stem 330S or 340S in the second direction D2 intersecting the first direction D1.

Specifically, the first electrode 330 may include a first electrode stem 330S extending in the first direction D1 and at least one first electrode branch 330B branching from the first electrode stem 330S and extending in the second direction D2. Although not illustrated in the drawing, the first electrode stem 330S may have an end connected to a signal application pad and another end extending in the first direction D1 and electrically isolated between the pixels PX. The signal application pad may be electrically connected to the display device 10 or an external power source so as to transmit an electrical signal to the first electrode stem 330S or to apply AC power in case that the light emitting elements 350 are aligned.

The first electrode stem 330S of any one pixel may lie on substantially the same straight line as the first electrode stem 330S of a neighboring pixel (e.g., adjacent in the first direction D1) belonging to the same row. In other words, both ends of the first electrode stem 330S of one pixel may end between pixels PX, but the first electrode stem 330S of a neighboring pixel may be aligned on an extension of the first electrode stem 330S of the one pixel. This arrangement of the first electrode stems 330S may be achieved by forming one stem electrode in a manufacturing process and then cutting the stem electrode using a laser or the like after the alignment process of the light emitting elements 350 is performed. Accordingly, the first electrode stems 330S respectively disposed in the pixels PX may transmit different electrical signals to their respective first electrode branches 330B, and the first electrode branches 330B may be driven separately.

The first electrode branch 330B may branch from at least a portion of the first electrode stem 330S and may extend in the second direction D2 to a position spaced apart from the second electrode stem 340S facing the first electrode stem 330S. For example, the first electrode branch 330B disposed in each pixel PX may have an end connected to the first electrode stem 330S and another end spaced apart from the second electrode stem 340S. Since the first electrode branch 330B is connected to the first electrode stem 330S which is electrically isolated in each pixel PX, a different electrical signal may be transmitted to each pixel PX.

One or more first electrode branches 330B may be disposed in each pixel PX. Although two first electrode branches 330B are disposed in FIG. 1, multiple first electrode branches 330B can be disposed without being limited to two. In this case, the first electrode branches 330B may be spaced apart from each other and may each be spaced apart from a second electrode branch 340B described below. In some embodiments, the second electrode branch 340B may be disposed between the first electrode branches 330B. Therefore, each pixel PX may have a symmetrical structure with respect to the second electrode branch 340B, but the present disclosure is not limited thereto.

The second electrode 340 may include a second electrode stem 340S extending in the first direction D1 and spaced apart from the first electrode stem 330S to face the first electrode stem 330S and at least one second electrode branch 340B branching from the second electrode stem 340S, extending in the second direction D2 and spaced apart from the first electrode branches 330B to face the first electrode branches 330B. Like the first electrode stem 330S, the second electrode stem 340S may have an end connected to a signal application pad. However, another end of the second electrode stem 340S may extend to pixels PX adjacent in the first direction D1. For example, the second electrode stem 340S may be electrically connected between the pixels PX. Accordingly, both ends of the second electrode stem 340S of any one pixel may be electrically connected to respective ends of the second electrode stems 340S of neighboring pixels between the pixels PX. Thus, the same electrical signal may be transmitted to each pixel PX.

The second electrode branch 340B may branch from at least a portion of the second electrode stem 340S and extend in the second direction D2 to a position spaced apart from the first electrode stem 330S. For example, the second electrode branch 340B disposed in each pixel PX may have an end connected to the second electrode stem 340S and another end spaced apart from the first electrode stem 330S. Since the second electrode branch 340B is electronically connected to the second electrode stem 340S that is electrically connected to each pixel PX, the same electrical signal may be transmitted to each pixel PX.

The second electrode branch 340B may be spaced apart from the first electrode branches 330B to face the first electrode branches 330B. Here, since the first electrode stem 330S and the second electrode stem 340S are spaced apart to face each other in opposite directions with respect to the center of each pixel PX, the first electrode branches 330B and the second electrode branch 340B may extend in opposite directions. In other words, the first electrode branches 330B may extend in one direction of the second direction D2, and the second electrode branch 340B may extend in the other direction of the second direction D2. Thus, respective ends of the branches may be disposed in opposite directions with respect to the center of each pixel PX. However, the present disclosure is not limited thereto, and the first electrode stem 330S and the second electrode stem 340S may also be disposed in the same direction with respect to the center of each pixel PX and spaced apart from each other. In this case, the first electrode branches 330B and the second electrode branch 340B respectively branching from the first and second electrode stems 330S and 340S may extend in the same direction.

The light emitting elements 350 may be aligned between the first electrode branches 330B and the second electrode branch 340B. Each of at least some of the light emitting elements 350 may have a first end electrically connected to one of the first electrode branches 330B and a second end electrically connected to the second electrode branch 340B. One of contact electrodes 360 may be disposed on each of the first and second electrode branches 330B and 340B connected to the light emitting elements 350. The contact electrodes 360 may electrically contact the light emitting elements 350 so that the light emitting elements 350 are electrically connected to the electrode branches 330B and 340B. The contact electrodes 360 may electrically contact at least sides of both ends of each light emitting element 350. Accordingly, the light emitting elements 350 may receive an electrical signal and may emit light of a specific color.

In some embodiments, the first ends of the light emitting elements 350 electrically contacting the first electrode branches 330B may be n-type doped conductive material layers, and the second ends of the light emitting elements 350 contacting the second electrode branch 340B may be p-type doped conductive material layers. However, the present disclosure is not limited thereto, and the opposite may also be the case.

The first insulation layer 510 (see, e.g., FIG. 3) may be disposed on the first electrode 330 and the second electrode 340 to cover but partially expose them. The first insulation layer 510 may cover the first electrode 330 and the second electrode 340 but may include the openings 510P to expose a portion of an upper surface of each of the first electrode 330 and the second electrode 340, for example, a portion of an upper surface of each of the first electrode branches 330B and the second electrode branch 340B. The light emitting elements 350 may be disposed on the first insulation layer 510 between the first electrode branches 330B and the second electrode branch 340B where the openings 510P are not disposed.

The first insulation layer 510 may cover the first electrode 330 and the second electrode 340 to protect them and electrically insulate them from each other. The first insulation layer 510 may be disposed to cover both sides of each of the first electrode branches 330B and the second electrode branch 340B and may also be disposed in a space between the sides of each first electrode branch 330B and the second electrode branch 340B. Accordingly, the first insulation layer 510 may cover the facing sides of each first electrode branch 330B and the second electrode branch 340B spaced apart from each other to electrically insulate them, and the light emitting elements 350 may be disposed on the first insulation layer 510 in the abovementioned space.

The first insulation layer 510 disposed in areas where the light emitting elements 350 are not disposed, for example, the first insulation layer 510 disposed on the first electrode branches 330B and the second electrode branch 340B, may be patterned to form the openings 510P. The first insulation layer 510 may remain unetched between each first electrode branch 330B and the second electrode branch 340B, and the light emitting elements 350 may be disposed on the first insulation layer 510. The first insulation layer 510 may be disposed to partially cover the first electrode branches 330B and the second electrode branch 340B in areas where the openings 510P are not disposed. This may be possible because only a second insulation layer 520 described below is patterned in the patterning of the second insulation layer 520 during the manufacture process of the display device 10 since each of the first insulation layer 510 and the second insulation layer 520 may include materials having different etch selectivities.

Accordingly, an air gap of the first insulation layer 510 may not be formed on the lower surface of each light emitting element 350 contacting the first insulation layer 510 by a process performed during the manufacture of the display device 10. The material of the contact electrodes 360 contacting both side surfaces of each light emitting element 350 may be prevented from being broken by an air gap on the lower surface of each light emitting element 350. This will be described in more detail below with reference to other drawings.

As described above, the openings 510P formed by patterning the first insulation layer 510 (see FIG. 3) may be disposed on the first electrode branches 330B and the second electrode branch 340B. The contact electrodes 360 may electrically contact the first electrode branches 330B and the second electrode branch 340B through the openings 510P.

Figure 2:
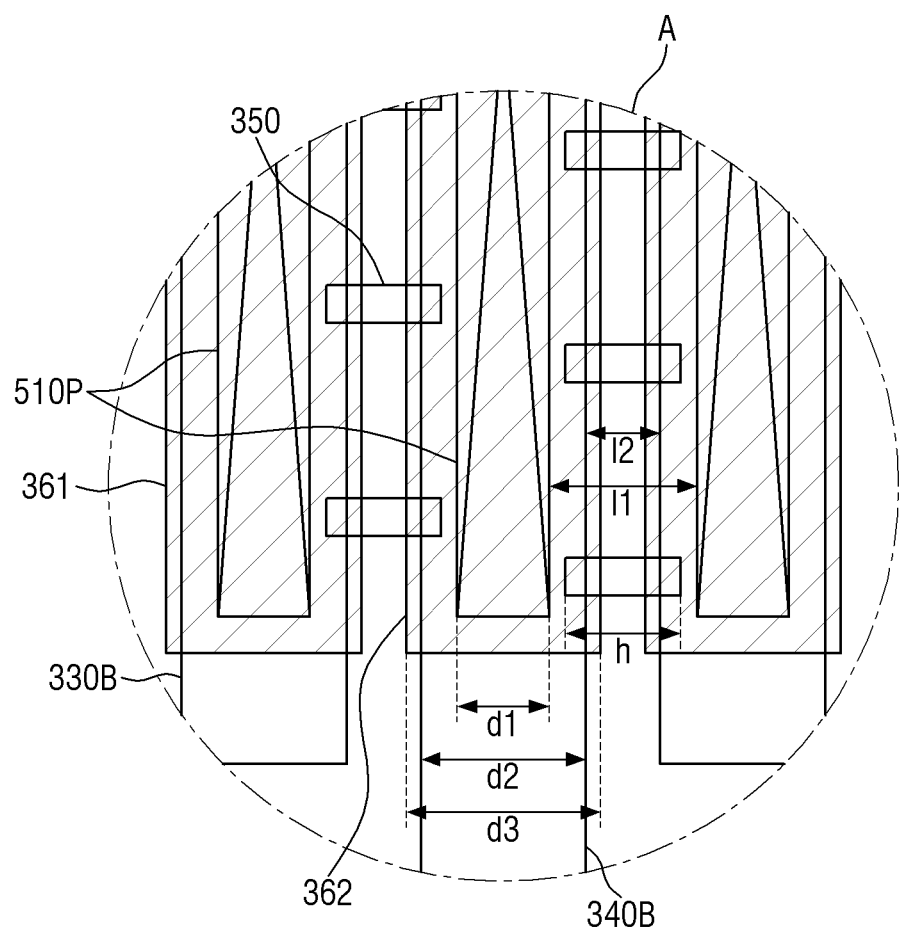
FIG. 2 is a schematic enlarged view of portion A of FIG. 1.

FIG. 2 is a schematic enlarged view of portion A of FIG. 1.

Referring to FIGS. 1 and 2, the openings 510P may be disposed to partially expose the upper surfaces of the first electrode branches 330B and the second electrode branch 340B.

Since the electrode branches 330B and 340B are spaced apart from each other in the first direction D1, the openings 510P may also be spaced apart from each other in the first direction D1. Although not illustrated in the drawings, the first insulation layer 510 (see FIG. 3) may be disposed in areas where the openings 510P are not disposed to cover each electrode 330 or 340.

The openings 510P may be disposed on the electrode branches 330B and 340B, respectively, and may extend in the second direction D2. Of both ends of each opening 510P in the second direction D2, an end in the direction of an electrode stem 330S or 340S may be disposed at a position spaced apart from the electrode stem 330S and 340S so as not to overlap the electrode stem 330S or 340S, and the other end may be disposed at a position spaced apart inwardly from an end of an electrode branch 330B or 340B.

Both ends of each opening 510P in the first direction D1 may be respectively spaced apart inwardly from both sides of an electrode branch 330B or 340B. Each opening 510P may have a predetermined width based on the center of an electrode branch 330B or 340B and thus may be spaced apart inwardly from both sides of the first electrode branch 330B or the second electrode branch 340B.

A width d1 of each opening 510P measured in the first direction D1 may be smaller than a width d2 of each electrode branch 330B or 340B measured in the first direction D1 (d1<d2). The contact electrodes 360 described below may be disposed to partially cover the electrode branches 330B and 340B and the first insulation layer 510 and may contact the electrodes 330 and 340 through the openings 510P, respectively. Here, a width d3 of each contact electrode 360 measured in the first direction D1 may be greater than the width d2 of each electrode branch 330B or 340B measured in the first direction D1 (d2<d3). In other words, each opening 510P may be substantially disposed inside an electrode branch 330B or 340B in a plan view.

The light emitting elements 350 may be disposed on the first insulation layer 510 between the electrode branches, for example, between each first electrode branch 330B and the second electrode branch 340B where the openings 510P are not disposed. The first end of each light emitting element 350 may be electrically connected to a first electrode branch 330B, and the second end may be electrically connected to the second electrode branch 340B. These contact parts may not contact the opening 510P on each electrode branch 330B or 340B. For example, a length h of a long axis of each light emitting element 350 may be smaller than a distance l1 between facing side surfaces of the openings 510P but may be greater than a distance l2 between facing side surfaces of the electrode branches 330B and 340B (l2<h<l1).

Accordingly, respective ends of each light emitting element 350 may be electrically connected to a first electrode branch 330B and the second electrode branch 340B, and the contact electrodes 360 may electrically contact both ends of each light emitting element 350 and the electrodes 330 and 340 through the openings 510P.

In the above drawings, it is illustrated that the contact electrodes 360 may electrically contact the first electrode branches 330B and the second electrode branch 340B through the openings 510P. However, the first insulation layer 510 may also be disposed on each first electrode branch 330B, the second electrode branch 340B, and a space between them. The disposition of the first insulation layer 510 will be described in detail below with reference to a cross-sectional view.

As illustrated in FIG. 1, the first electrode stem 330S and the second electrode stem 340S may be electrically connected to a thin-film transistor 120 and a power wiring 161, which will be described below, through contact holes, for example, a first electrode contact hole CNTD and second electrode contact holes CNTS, respectively. Although the contact holes on the first electrode stem 330S and the second electrode stem 340S are disposed in each pixel PX in FIG. 1, the present disclosure is not limited thereto. Since the second electrode stem 340S extends to and is electrically connected to adjacent pixels PX as described above, it may also be electrically connected to thin-film transistors through one contact hole in some embodiments.

The more detailed structure of members disposed in the display device 10 will now be described with reference to FIG. 3.

Figure 3:
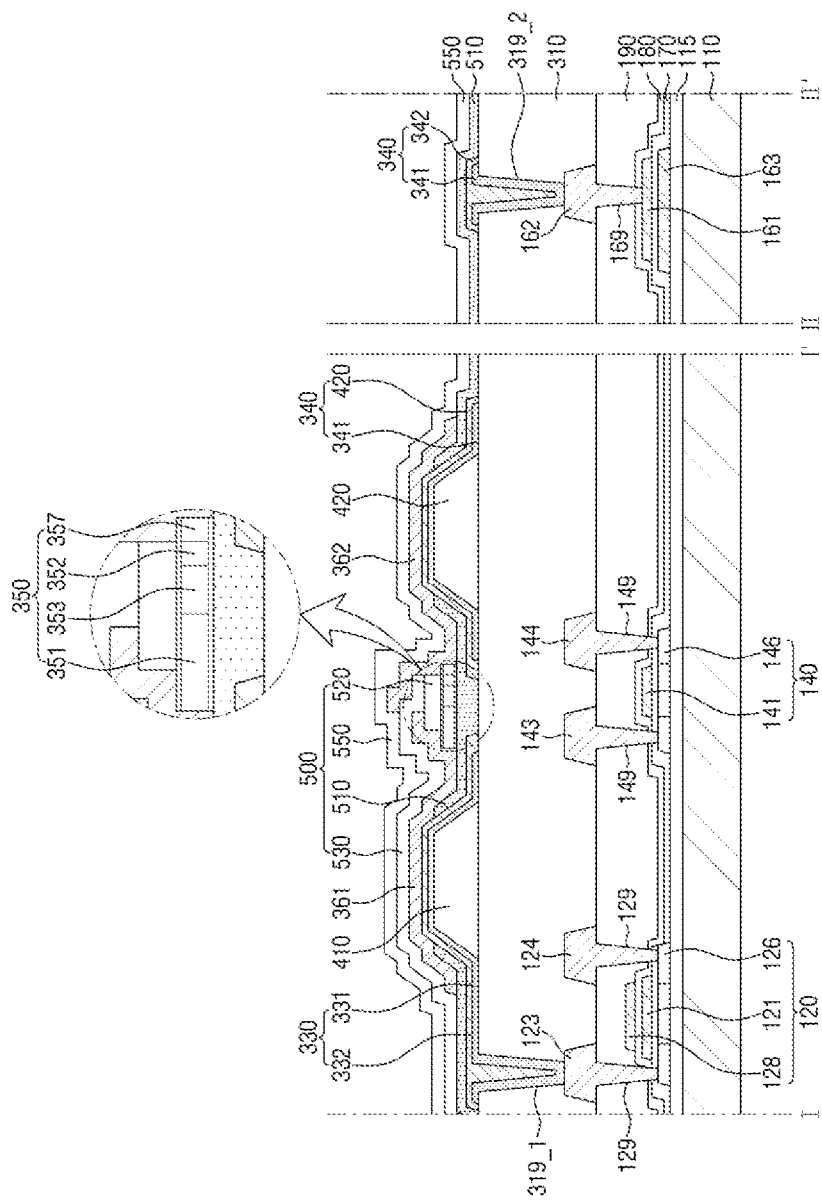
FIG. 3 is a schematic cross-sectional view taken along lines I-I" and II-II' of FIG. 1.

FIG. 3 is a schematic cross-sectional view taken along lines I-I' and II-II' of FIG. 1. Although only one pixel PX is illustrated in FIG. 3, the same may apply to other pixels. Line I-I' of FIG. 3 may be a cutting line used to show a cross section across the first end of a light emitting element 350 and the second end opposite the first end.

Referring to FIGS. 1 and 3, the display device 10 may include a substrate 110, thin-film transistors 120 and 140 disposed on the substrate 110, and the electrodes 330 and 340 and the light emitting element 350 disposed above the thin-film transistors 120 and 140. The thin-film transistors may include a first thin-film transistor 120 and a second thin-film transistor 140 which may be a driving transistor and a switching transistor, respectively. Each of the thin-film transistors 120 and 140 may include an active layer, a gate electrode, a source electrode, and a drain electrode. The first electrode 330 may be electrically connected to the drain electrode of the first driving transistor 120.

More specifically, the substrate 110 may be an insulating substrate. The substrate 110 may be made of an insulating material such as glass, quartz, or polymer resin. Examples of the polymer material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations of these materials. The substrate 110 may be a rigid substrate or a flexible substrate that can be bent, folded, or rolled.

A buffer layer 115 may be disposed on the substrate 110. The buffer layer 115 may prevent diffusion of impurity ions, prevent penetration of moisture or outside air, and perform a surface planarization function. The buffer layer 115 may include silicon nitride, silicon oxide, or silicon oxynitride.

A semiconductor layer is disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, or an oxide semiconductor.

A first gate insulating layer 170 is disposed on the semiconductor layer. The first gate insulating layer 170 covers the semiconductor layer. The first gate insulating layer 170 may function as gate insulating films of thin-film transistors. The first gate insulating layer 170 may include silicon oxide, silicon nitride, silicon oxynitride, aluminum oxide, tantalum oxide, hafnium oxide, zirconium oxide, titanium oxide, etc. These materials may be used alone or in combination with each other.

A first conductive layer is disposed on the first gate insulating layer 170. The first conductive layer includes a first gate electrode 121 disposed on the first active layer 126 of the first thin-film transistor 120 with the first gate insulating layer 170 interposed between them, a second gate electrode 141 disposed on the second active layer 146 of the second thin-film transistor 140, and the power wiring 161 disposed on the auxiliary layer 163. The first conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single film or a multilayer film.

A second gate insulating layer 180 is disposed on the first conductive layer. The second gate insulating layer 180 may be an interlayer insulating film. The second gate insulating layer 180 may be made of an inorganic insulating material such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer includes a capacitor electrode 128 disposed on the first gate electrode 121 with the second gate insulating layer 180 interposed between them. The capacitor electrode 128 may form a storage capacitor with the first gate electrode 121.

Like the first conductive layer, the second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is disposed on the second conductive layer. The interlayer insulating layer 190 may be an interlayer insulating film. Further, the interlayer insulating layer 190 may perform a surface planarization function. The interlayer insulating layer 190 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

A third conductive layer is disposed on the interlayer insulating layer 190. The third conductive layer includes a first drain electrode 123 and a first source electrode 124 of the first thin-film transistor 120, a second drain electrode 143 and a second source electrode 144 of the second thin-film transistor 140, and a power electrode 162 disposed on the power wiring 161.

The first source electrode 124 and the first drain electrode 123 may respectively be electrically connected to the first active layer 126 through first contact holes 129 penetrating the interlayer insulating layer 190 and the second gate insulating layer 180. The second source electrode 144 and the second drain electrode 143 may respectively be electrically connected to the second active layer 146 through second contact holes 149 penetrating the interlayer insulating layer 190 and the second gate insulating layer 180. The power electrode 162 may be electrically connected to the power wiring 161 through a third contact hole 169 penetrating the interlayer insulating layer 190 and the second gate insulating layer 180.

The third conductive layer may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single film or a multilayer film. For example, the third conductive layer may have a stacked structure of Ti/Al/Ti, Mo/Al/Mo, Mo/AlGe/Mo, or Ti/Cu.

An insulating substrate layer 310 is disposed on the third conductive layer. The insulating substrate layer 310 may be made of an organic material such as polyacrylates resin, epoxy resin, phenolic resin, polyamides resin, polyimides resin, unsaturated polyesters resin, polyphenylenethers resin, polyphenylenesulfides resin or benzocyclobutene (BCB). The surface of the insulating substrate layer 310 may be flat.

Barrier ribs 410 and 420 may be disposed on the insulating substrate layer 310. The barrier ribs 410 and 420 may be spaced apart to face each other in each pixel PX, and the first electrode 330 and the second electrode 340 may be disposed on the barrier ribs 410 and 420 spaced apart from each other, for example, on a first barrier rib 410 and a second barrier rib 420, respectively. In FIGS. 1 and 3, three barrier ribs 410 and 420, specifically, two first barrier ribs 410 and one second barrier rib 420 may be disposed in one pixel PX, and thus two first electrodes 330 and one second electrode 340 may be disposed.

However, the present disclosure is not limited thereto, and a larger number of barrier ribs 410 and 420 may also be disposed in one pixel PX. For example, a larger number of barrier ribs 410 and 420 may be disposed, and thus a larger number of first electrodes 330 and second electrodes 340 may be disposed. The barrier ribs 410 and 420 may also include at least one first barrier rib 410 on which the first electrode 330 is disposed and at least one second barrier rib 420 on which the second electrode 340 is disposed. In this case, the first barrier rib 410 and the second barrier rib 420 may be spaced apart to face each other and may be alternately disposed in one direction. In some embodiments, two first barrier ribs 410 may be spaced apart from each other, and one second barrier rib 420 may be disposed between the first barrier ribs 410 spaced apart from each other.

Although not illustrated in FIG. 3, the first electrode 330 and the second electrode 340 may respectively include the electrode stems 330S and 340S and the electrode branches 330B and 340B as described above. It can be understood that the first electrode branch 330B and the second electrode branch 340B are disposed on the first barrier rib 410 and the second barrier rib 420 of FIG. 3, respectively.

The barrier ribs 410 and 420 may be formed of substantially the same material in one process. In this case, the barrier ribs 410 and 420 may form one lattice pattern. The barrier ribs 410 and 420 may include polyimide (PI).

Although not illustrated in the drawings, at least some of the barrier ribs 410 and 420 may be disposed at the boundary of each pixel PX to separate the pixels PX. These barrier ribs may also be disposed in a substantially lattice pattern together with the first barrier rib 410 and the second barrier rib 420 described above. At least some of the barrier ribs 410 and 420 disposed at the boundary of each pixel PX may also be formed to cover electrode lines of the display device 10.

At least a portion of each of the barrier ribs 410 and 420 may protrude from the insulating substrate layer 310. Each of the barrier ribs 410 and 420 may protrude upward from a plane in which the light emitting element 350 is disposed, and at least a portion of the protruding portion may have a slope. Reflective layers 331 and 341 to be described later may be disposed on the sloping and protruding barrier ribs 410 and 420 to reflect incident light. Light directed from the light emitting element 350 to the reflective layers 331 and 341 may be reflected toward the outside of the display device 10, for example, toward above the barrier ribs 410 and 420. The shape of the protruding barrier ribs 410 and 420 is not particularly limited. In FIG. 3, each of the protruding barrier ribs 410 and 420 has angled corners due to inclined side surfaces and a flat upper surface. However, the present disclosure is not limited thereto, and each of the barrier ribs 410 and 420 may also protrude in a curved shape.

The reflective layers 331 and 341 may be disposed on the barrier ribs 410 and 420.

A first reflective layer 331 covers the first barrier rib 410 and is electrically connected to the first drain electrode 123 of the first thin-film transistor 120 through a fourth contact hole 319_1 penetrating the insulating substrate layer 310. A second reflective layer 341 covers the second barrier rib 420 and is electrically connected to the power electrode 162 through a fifth contact hole 319_2 penetrating the insulating substrate layer 310.

The first reflective layer 331 may be electrically connected to the first drain electrode 123 of the first thin-film transistor 120 through the fourth contact hole 319_1 in the pixel PX. Therefore, the first thin-film transistor 120 may be disposed in an area overlapping the pixel PX. In FIG. 1, the first reflective layer 331 is electrically connected to the first thin-film transistor 120 through the first electrode contact hole CNTD disposed in the first electrode stem 330S. For example, the first electrode contact hole CNTD may be the fourth contact hole 319_1.

The second reflective layer 341 may be electrically connected to the power electrode 162 through the fifth contact hole 3192 in the pixel PX. In FIG. 3, the second reflective layer 341 is connected through the fifth contact hole 319_2 in one pixel PX. In FIG. 1, the second electrode 340 of each pixel PX is electrically connected to the power wiring 161 through second electrode contact hole CNTS on the second electrode stem 340S. For example, each of the second electrode contact holes CNTS may be the fifth contact hole 319_2.

However, the present disclosure is not limited thereto. For example, in FIG. 1, the second electrode contact holes CNTS may be disposed at various positions on the second electrode stem 340S and, in some cases, may be located on the second electrode branch 340B. The second reflective layer 341 may be connected to one second electrode contact hole CNTS or fifth contact hole 319_2 in an area other than one pixel PX.

A non-emission area in which the light emitting elements 350 are not disposed may exist in an area other than the emission portion in which the pixels PX of the display device 10 are disposed, for example, in an area outside the pixels PX. As described above, the respective second electrodes 340 of the pixels PX may be electrically connected to each other by the second electrode stem 340S to receive the same electrical signal.

In some embodiments, in the case of the second electrode 340, the second electrode stem 340S may be electrically connected to the power electrode 162 through one second electrode contact hole CNTS in the non-emission area located on the periphery of the display device 10. Even if the second electrode stem 340S is electrically connected to the power electrode 162 through one contact hole unlike in the display device 10 of FIG. 1, the same electrical signal may be transmitted to the second electrode branch 340B of each pixel PX because the second electrode stem 340S extends to and is electrically connected to adjacent pixels PX. The position of the contact hole through which the second electrode 340 of the display device 10 receives an electrical signal from the power electrode 162 may vary depending on the structure of the display device 10, but the present disclosure is not limited thereto.

Referring again to FIGS. 1 and 3, the reflective layers 331 and 341 may include a material having high reflectivity in order to reflect light emitted from the light emitting element 350. For example, the reflective layers 331 and 341 may include a material such as silver (Ag) or copper (Cu), but the present disclosure is not limited thereto.

A first electrode layer 332 and a second electrode layer 342 may be disposed on the first reflective layer 331 and the second reflective layer 341, respectively.

The first electrode layer 332 is disposed directly on the first reflective layer 331. The first electrode layer 332 and the first reflective layer 331 may have substantially the same pattern. The second electrode layer 342 is disposed directly on the second reflective layer 341 and spaced apart from the first electrode layer 332. The second electrode layer 342 and the second reflective layer 341 may have substantially the same pattern.

In an embodiment, the electrode layers 332 and 342 may cover the reflective layers 331 and 341 disposed thereunder, respectively. For example, the electrode layers 332 and 342 may be formed to be larger than the reflective layers 331 and 341 to cover side surfaces of ends of the electrode layers 332 and 342. However, the present disclosure is not limited thereto.

The first electrode layer 332 and the second electrode layer 342 may respectively transmit electrical signals, which are transmitted to the first reflective layer 331 and the second reflective layer 341 connected to the first thin-film transistor 120 or the power electrode 162, to the contact electrodes 360 which will be described later. The electrode layers 332 and 342 may include a transparent conductive material. For example, the electrode layers 332 and 342 may include a material such as indium tin oxide (ITO), indium zinc oxide (IZO), or indium tin-zinc oxide (ITZO). In some embodiments, the reflective layers 331 and 341 and the electrode layers 332 and 342 may form a structure in which one or more transparent conductive layers such as ITO, IZO or ITZO and one or more metal layers such as silver or copper are stacked. For example, the reflective layers 331 and 341 and the electrode layers 332 and 342 may form a stacked structure of ITO/silver (Ag)/ITO.

The first reflective layer 331 and the first electrode layer 332 disposed on the first barrier rib 410 may form (or constitute) the first electrode 330. The first electrode 330 may protrude from both ends of the first barrier rib 410. Accordingly, the protruding areas of the first electrode 330 may contact the insulating substrate layer 310. The second reflective layer 341 and the second electrode layer 342 disposed on the second barrier rib 420 may form (or constitute) the second electrode 340. The second electrode 340 may protrude from both ends of the second barrier rib 420. Accordingly, the protruding areas of the second electrode 340 may contact the insulating substrate layer 310.

The first electrode 330 and the second electrode 340 may cover the entire area of the first barrier rib 410 and the entire area of the second barrier rib 420, respectively. However, as described above, the first electrode 330 and the second electrode 340 are spaced apart to face each other. For example, the first electrode branch 330B and the second electrode branch 340B are parallel to and spaced apart from each other, the first insulation layer 510 is disposed between them as will be described below, and the light emitting element 350 may be disposed on the first insulation layer 510.

The first reflective layer 331 may receive a driving voltage from the first thin-film transistor 120, and the second reflective layer 341 may receive a power supply voltage from the power wiring 161. Therefore, the first electrode 330 and the second electrode 340 receive the driving voltage and the power supply voltage, respectively. As will be described below, the first electrode 330 may be electrically connected to the first thin-film transistor 120, and the second electrode 340 may be electrically connected to the power wiring 161. Accordingly, a first contact electrode 361 and a second contact electrode 362 disposed on the first electrode 330 and the second electrode 340 may receive the driving voltage and the power supply voltage, respectively. The driving voltage and the power supply voltage may be transmitted to the light emitting element 350, and a current may flow through the light emitting element 350, causing the light emitting element 350 to emit light.

The first insulation layer 510 is disposed on some areas of the first electrode 330 and the second electrode 340. The first insulation layer 510 may cover most of the upper surfaces of the first electrode 330 and the second electrode 340 and may include the openings 510P partially exposing the first electrode 330 and the second electrode 340.

The first insulation layer 510 may be disposed in a space between the first electrode 330 and the second electrode 340. In a plan view, the first insulation layer 510 may have an island shape or a linear shape formed along the space between the first electrode branch 330B and the second electrode branch 340B. In FIG. 3, the first insulation layer 510 is disposed in the space between one first electrode 330 (e.g., the first electrode branch 330B) and one second electrode 340 (e.g., the second electrode branch 340B). However, as described above, since multiple the first electrodes 330 and the second electrodes 340 may be provided, the first insulation layer 510 may also be disposed between one first electrode 330 and another second electrode 340 or between one second electrode 340 and another first electrode 330.

The first insulation layer 510 may overlap some areas of the electrodes 330 and 340, for example, areas of the first electrode 330 and the second electrode 340 which protrude in directions facing each other and may partially overlap the electrodes 330 and 340 on the inclined side surfaces of the barrier ribs 410 and 420. For example, the first insulation layer 510 may cover ends of the first electrode 330 and the second electrode 340 which protrude in the directions facing each other in a cross section. The first insulation layer 510 may protect areas overlapping the electrodes 330 and 340 and electrically insulate the areas from each other. Accordingly, a portion of a lower surface of the first insulation layer 510 may contact the insulating substrate layer 310, and a portion of the lower surface and a side surface of the first insulation layer 510 may contact each electrode 330 or 340.

However, the present disclosure is not limited thereto. In some embodiments, the first insulation layer 510 may be disposed on the first electrode 330 and the second electrode 340 to partially overlap the flat upper surfaces of the barrier ribs 410 and 420. The lower surface of the first insulation layer 510 may partially overlap the electrodes 330 and 340 on the flat upper surfaces of the barrier ribs 410 and 420.

The first insulation layer 510 may not be disposed on each electrode 330 or 340, but an opening 510P may be disposed to expose a portion of the upper surface of each electrode 330 or 340. Specifically, the opening 510P may be disposed to expose a portion of the upper surface of each of the first electrode branch 330B and the second electrode branch 340B. As described above with reference to FIG. 2, the opening 510P may have a predetermined width based on the center of each electrode branch 330B or 340B and thus may be spaced apart inwardly from both sides of each of the first electrode branch 330B and the second electrode branch 340B.

Accordingly, as illustrated in FIG. 3, the openings 510P may partially overlap the first electrode 330 and the second electrode 340 on the inclined side surfaces of the barrier ribs 410 and 420. For example, the first electrode 330 and the second electrode 340 exposed by the openings 510P may be areas overlapping the flat upper surfaces and the inclined side surfaces of the barrier ribs 410 and 420. However, the present disclosure is not limited thereto. As described above, in case that the first insulation layer 510 is also disposed on the flat upper surfaces of the barrier ribs 410 and 420, the openings 510P may expose only the upper surfaces of the first electrode 330 and the second electrode 340. For example, the width of the exposed area of each of the first electrode 330 and the second electrode 340 may vary according to the width of the opening 510P.

The contact electrodes 360 described below may be disposed on the openings 510P, and the first electrode 330 and the second electrode 340 may electrically contact the contact electrodes 360. Since the contact electrodes 360 may electrically contact the light emitting element 350 disposed on the first insulation layer 510, they may transmit electrical signals, which are transmitted to the first electrode 330 and the second electrode 340, to the light emitting element 350. A contact area between a contact electrode 360 and each of the first electrode 330 and the second electrode 340 may vary according to the width of the opening 510P. This may be selected according to the number of light emitting elements 350 that can be placed in each pixel PX, an electrode material, etc.

At least one light emitting element 350 may be disposed between the first electrode 330 and the second electrode 340. Although only the light emitting elements 350 emitting light of the same color are disposed in each pixel PX in FIG. 1, the present disclosure is not limited thereto. As described above, light emitting elements 350 emitting light of different colors may also be disposed together in one pixel PX.

The light emitting element 350 may be a light emitting diode (LED). The light emitting element 350 may be a nanostructure having a size of generally nanometers. The light emitting element 350 may be an inorganic LED made of an inorganic material. In case that the light emitting element 350 is an inorganic LED, if a light emitting material having an inorganic crystal structure is placed between two opposing electrodes and an electric field is formed in a specific direction in the light emitting material, the inorganic LED may be aligned between the two electrodes having specific polarities.

The light emitting element 350 may be disposed on the first insulation layer 510 between the first electrode branch 330B and the second electrode branch 340B where the openings 510P are not disposed. Accordingly, the lower surface of the light emitting element 350 may contact an upper surface of the first insulation layer 510; and the insulating substrate layer 310, the first insulation layer 510 and the light emitting element 350 may be sequentially stacked between the first electrode branch 330B and the second electrode branch 340B.

The light emitting element 350 may be disposed on the first insulation layer 510 such that both sides of the light emitting element 350 are exposed, and the contact electrodes 360 described below may contact the exposed upper surfaces of the electrodes 330 and 340 and both sides of the light emitting element 350.

Referring to an enlarged view of FIG. 3, in some embodiments, the light emitting element 350 may have a structure in which a first conductivity type semiconductor layer 351, an active material layer 353, a second conductivity type semiconductor layer 352, and an electrode material layer 357 are stacked as will be described below. In the light emitting element 350, the first conductivity type semiconductor layer 351, the active material layer 353, the second conductivity type semiconductor layer 352, and the electrode material layer 357 may be stacked in this order in a direction parallel to the insulating substrate layer 310. In other words, the light emitting element 350 in which the above layers are stacked may be disposed in a horizontal direction parallel to the insulating substrate layer 310. However, the present disclosure is not limited thereto, and the light emitting element 350 may also be aligned in a direction opposite to the above stacking direction.

As described above, the length h of the long axis of the light emitting element 350 may be smaller than the distance l1 between the facing side surfaces of the openings 510P but may be greater than the distance l2 between the facing side surfaces of the electrode branches 330B and 340B (l2<h<l1). Accordingly, the contact electrodes 360 to be described later may smoothly electrically contact the side surfaces of both ends of the light emitting element 350; the first end of the light emitting element 350 may be electrically connected to the first electrode 330; and the second end may be electrically connected to the second electrode 340.

The above arrangement of the first insulation layer 510 and the openings 510P may be achieved by forming the first insulation layer 510 to entirely cover the first electrode 330 and the second electrode 340 and then partially patterning the first insulation layer 510 to form the openings 510P during the manufacture of the display device 10. The light emitting element 350 is disposed on the first insulation layer 510 between the first electrode 330 and the second electrode 340. When the openings 510P are formed, areas spaced apart from an area of the first insulation layer 510 where the light emitting element 350 is disposed are patterned. Accordingly, since an area adjacent to the light emitting element 350 is not patterned, it is possible to prevent some materials between the first insulation layer 510 and the light emitting element 350 from being removed.

The first insulation layer 510 may include an overlapping area which overlaps the lower surface of the light emitting element 350, a first non-overlapping area which extends outward from the first end of the light emitting element 350 and does not overlap the light emitting element 350, and a second non-overlapping area which extends outward from the second end of the light emitting element 350 and does not overlap the light emitting element 350. A contact surface of the overlapping area in which the first insulation layer 510 contacts the light emitting element 350 may be level with a portion of each of the first non-overlapping area and the second non-overlapping area of the first insulation layer 510 that contacts the electrodes 330 and 340, wherein the first non-overlapping area and the second non-overlapping area of the first insulation layer 510 do not overlap the light emitting element 350. For example, the contact electrodes 360 may be connected such that their material is not broken at the lower surface of the light emitting element 350. Therefore, the upper surface of the first insulation layer 510 and the lower surface of the light emitting element 350 may maintain a smooth contact, and the material of the contact electrodes 360 may be prevented from being broken in case that the contact electrodes 360 contact the light emitting element 350. The first insulation layer 510 may prevent the first conductivity type semiconductor layer 351 and the second conductivity type semiconductor layer 352 of the light emitting element 350 from directly contacting other members, thereby preventing damage of the light emitting element 350.

At least a portion of each of the first non-overlapping area and the second non-overlapping area of the first insulation layer 510 may be disposed in an area where the first electrode 330 or the second electrode 340 overlaps the inclined side surfaces of the barrier rib 410 or 420. For example, a portion of each of the first non-overlapping area and the second non-overlapping area may be located higher than the overlapping area in a cross section. However, the present disclosure is not limited thereto. The first non-overlapping area and the second non-overlapping area may also be level with the overlapping area and, in some cases, may also be disposed in areas where the first electrode 330 and the second electrode 340 overlap the flat upper surfaces of the barrier ribs 410 and 420 as described above. This will be described in detail below.

The second insulation layer 520 may be disposed on the light emitting element 350 to overlap at least a portion of the light emitting element 350. The second insulation layer 520 may protect the light emitting element 350 and may fix the light emitting element 350 between the first electrode 330 and the second electrode 340.

Although the second insulation layer 520 is disposed on an upper surface of the light emitting element 350 in a cross section in FIG. 3, it may also be disposed to cover an outer surface of the light emitting element 350. Although not illustrated in the drawing, a portion of the material of the second insulation layer 520 may also be disposed in an area where the lower surface of the light emitting element 350 contacts the first insulation layer 510. This may result from the permeation of a portion of the material of the second insulation layer 520 into an air gap formed in the first insulation layer 510 in contact with the lower surface of the light emitting element 350 when the second insulation layer 520 is formed on the light emitting element 350 after the light emitting element 350 is disposed on the first insulation layer 510 during the manufacture process of the display device 10.

The second insulation layer 520 is disposed to expose both side surfaces of the light emitting element 350. For example, in a cross section, the second insulation layer 520 disposed on the upper surface of the light emitting element 350 may be shorter than the light emitting element 350 in one axial direction. Therefore, the second insulation layer 520 may be recessed inward from both side surfaces of the light emitting element 350. Accordingly, the side surfaces of the first insulation layer 510, the light emitting element 350 and the second insulation layer 520 may be stacked in a staircase pattern. The contact electrodes 360 described below may smoothly and electrically contact the side surfaces of both ends of the light emitting element 350. However, the present disclosure is not limited thereto, and the length of the second insulation layer 520 may also be equal to the length of the light emitting element 350 so that both sides of them are aligned with each other. Like the first insulation layer 510, the second insulation layer 520 may also have an island shape or a linear shape formed along the space between the first electrode branch 330B and the second electrode branch 340B in a plan view.

The second insulation layer 520 may be disposed to cover the first insulation layer 510 and then may be patterned, for example, in areas where the light emitting element 350 is exposed to contact the contact electrodes 360. The patterning of the second insulation layer 520 may be performed through a conventional dry etching method or a wet etching method. Here, to prevent the first insulation layer 510 from being patterned, the first insulation layer 510 and the second insulation layer 520 may include materials having different etch selectivities. In other words, when the second insulation layer 520 is patterned, the first insulation layer 510 may function as an etching stopper.

Accordingly, even if the second insulation layer 520 is patterned to cover the outer surface of the light emitting element 350 and to expose both ends of the light emitting element 350, the material of the first insulation layer 510 may not be damaged. For example, the first insulation layer 510 and the light emitting element 350 may form a smooth contact surface at both ends of the light emitting element 350 where the light emitting element 350 electrically contacts the contact electrodes 360. When the contact electrodes 360 electrically contacting the light emitting element 350 are formed, an air gap due to patterning is not formed in the first insulation layer 510 contacting the lower surface of the light emitting element 350. Therefore, the material of the contact electrodes 360 can be prevented from being broken by the air gap. This will be described in more detail below.

Referring again to FIG. 3, the first contact electrode 361 disposed on the first electrode 330 and overlapping at least a portion of the second insulation layer 520 and the second contact electrode 362 disposed on the second electrode 340 and overlapping at least a portion of the second insulation layer 520 may be disposed on the second insulation layer 520.

The first contact electrode 361 may be disposed on the first electrode 330 to partially cover the first electrode 330, and a lower surface of the first contact electrode 361 may partially and electrically contact the light emitting element 350, the first insulation layer 510 and the second insulation layer 520. An end of the first contact electrode 361 in a direction in which the second electrode 340 is disposed is disposed on the second insulation layer 520.

The second contact electrode 362 may be disposed on the second electrode 340 to partially cover the second electrode 340, and a lower surface of the second contact electrode 362 may partially and electrically contact the light emitting element 350, the first insulation layer 510 and a third insulation layer 530. Both ends of the second contact electrode 362 in directions in which the first electrode 330 is disposed are disposed on the third insulation layer 530.

In other words, the first contact electrode 361 and the second contact electrode 362 may be disposed on the upper surfaces of the first electrode 330 and the second electrode 340, respectively. Specifically, the first contact electrode 361 and the second contact electrode 362 may be disposed on the upper surfaces of the first electrode 330 and the second electrode 340 to electrically contact the first electrode layer 332 and the second electrode layer 342, respectively. The first insulation layer 510 and the second insulation layer 520 may be patterned in areas disposed to cover the first electrode 330 and the second electrode 340 on the upper surfaces of the first barrier rib 410 and the second barrier rib 420. Accordingly, the first electrode layer 332 and the second electrode layer 342 of the first electrode 330 and the second electrode 340 may be exposed and may be electrically connected to the contact electrodes 360 in the exposed areas, respectively.

The first contact electrode 361 and the second contact electrode 362 may electrically contact the first end and the second end of the light emitting element 350, for example, the first conductive type semiconductor layer 351 and the electrode material layer 357, respectively. Accordingly, the first contact electrode 361 and the second contact electrode 362 may transmit electrical signals, which are transmitted to the first electrode layer 332 and the second electrode layer 342, to the light emitting element 350.

The first contact electrode 361 and the second contact electrode 362 may be spaced apart from each other on the second insulation layer 520 or the third insulation layer 530. For example, the first contact electrode 361 and the second contact electrode 362 may contact the light emitting element 350 and the second insulation layer 520 or the third insulation layer 530 but may be spaced apart in the stacked direction on the second insulation layer 520 and thus be electrically insulated from each other. Therefore, the first contact electrode 361 and the second contact electrode 362 may receive different powers from the first thin-film transistor 120 and the power wiring 161, respectively. For example, the first contact electrode 361 may receive a driving voltage applied from the first thin-film transistor 120 to the first electrode 330, and the second contact electrode 362 may receive a common power supply voltage applied from the power wiring 161 to the second electrode 340. However, the present disclosure is not limited thereto.

The first contact electrode 361 may electrically contact an area of the first electrode 330 which is exposed by the opening 510P but may be disposed not to overlap an area of the first electrode 330 which electrically contacts the first thin-film transistor 120 through the fourth contact hole 319_1. The second contact electrode 362 may electrically contact an area of the second electrode 340 which is exposed by the opening 510P but may be disposed not to overlap an area of the second electrode 340 which electrically contacts the power wiring 161 through the fifth contact hole 319_2. For example, referring also to FIG. 1, the first contact electrode 361 may not be formed in the first electrode contact hole CNTD on the first electrode stem 330S, and the second contact electrode 362 may not be formed in the second electrode contact hole CNTS on the second electrode stem 340S. The first contact electrode 361 and the second contact electrode 362 may substantially be formed only on the electrode branches 330B and 340B, respectively. However, the present disclosure is not limited thereto. In some cases, each of the first contact electrode 361 and the second contact electrode 362 may also be disposed on an area of the first electrode branch 330S or the second electrode branch 340S.

The contact electrodes 360 may include a conductive material such as ITO, IZO, ITZO, or aluminum (Al). However, the present disclosure is not limited thereto.

The contact electrodes 360 and the electrode layers 332 and 342 may include the same material. The contact electrodes 360 may be disposed on the electrode layers 332 and 342 and may electrically contact the electrode layers 332 and 342. The contact electrodes 360 and the electrode layers 332 and 342 may be in substantially the same pattern. For example, the first contact electrode 361 and the second contact electrode 362 in contact with the first electrode layer 332 and the second electrode layer 342 may receive electrical signals transmitted to the first electrode layer 332 and the second electrode layer 342 and may transmit the received electrical signals to the light emitting element 350.

As described above, the first contact electrode 361 and the second contact electrode 362 may smoothly and electrically contact the side surfaces of both ends of the light emitting element 350 without their material being broken.

The material of the first insulation layer 510 may remain undamaged or unetched at a surface where the light emitting element 350 and the first insulation layer 510 contact each other. When the second insulation layer 520 is patterned to expose both ends of the light emitting element 350, the first insulation layer 510 may function as an etching stopper, and only the second insulation layer 520 may be etched because the first insulation layer 510 and the second insulation layer 520 may have different etch selectivities.

Accordingly, the lower surface of the light emitting element 350 and the first insulation layer 510 may maintain a smooth contact surface without damaging or etching of the material of the first insulation layer 510. Even if the contact electrodes 360 including an inorganic material have poor step coverage, the material of the contact electrodes 360 may not be formed on the lower surface of the light emitting element 350 and may be prevented from being broken by an air gap on the lower surface of the light emitting element 350.

The third insulation layer 530 may be disposed on the first contact electrode 361 to electrically insulate the first contact electrode 361 and the second contact electrode 362 from each other. The third insulation layer 530 may cover the first contact electrode 361 but may not overlap a portion of the light emitting element 350 so that the light emitting element 350 can electrically contact the second contact electrode 362. On an upper surface of the second insulation layer 520, the third insulation layer 530 may partially contact the first contact electrode 361, the second contact electrode 362, and the second insulation layer 520. The third insulation layer 530 may cover an end of the first contact electrode 361 on the upper surface of the second insulation layer 520. Accordingly, the third insulation layer 530 may protect the first contact electrode 361 while electrically insulating the first contact electrode 361 from the second contact electrode 362.

An end of the third insulation layer 530 in the direction in which the second electrode 340 is disposed may be aligned with a side surface of the second insulation layer 520.

In some embodiments, the third insulation layer 530 may be omitted from the display device 10. Accordingly, the first contact electrode 361 and the second contact electrode 362 may be disposed on substantially the same plane and may be electrically insulated from each other by a passivation layer 550 which will be described below.

The passivation layer 550 may be formed on the third insulation layer 530 and the second contact electrode 362 to protect the members disposed on the insulating substrate layer 310 from the external environment. If the first contact electrode 361 and the second contact electrode 362 are exposed, the contact electrode material may be broken due to an electrode damage. Therefore, they may be covered with the passivation layer 550. For example, the passivation layer 550 may cover the first electrode 330, the second electrode 340, the light emitting element 350, etc. As described above, if the third insulation layer 530 is omitted, the passivation layer 550 may be formed on the first contact electrode 361 and the second contact electrode 362. The passivation layer 550 may electrically insulate the first contact electrode 361 and the second contact electrode 362 from each other.

Each of the first insulation layer 510, the second insulation layer 520, the third insulation layer 530, and the passivation layer 550 described above may include an inorganic insulating material. For example, the first insulation layer 510, the second insulation layer 520, the third insulation layer 530, and the passivation layer 550 may include a material such as silicon oxide (SiOx), silicon nitride (SiNx), silicon oxynitride (SiOxNy), aluminum oxide ($Al_2O_3$), or aluminum nitride (AlN). The first insulation layer 510, the second insulation layer 520, the third insulation layer 530 and the passivation layer 550 may be made of the same material or different materials. Also, various materials that give an insulating property to the first insulation layer 510, the second insulation layer 520, the third insulation layer 530, and the passivation layer 550 are applicable.

The first insulation layer 510 and the second insulation layer 520 may have different etch selectivities as described above. For example, in case that the first insulation layer 510 includes silicon oxide (SiOx), the second insulation layer 520 may include silicon nitride (SiNx). For another example, in case that the first insulation layer 510 includes silicon nitride (SiNx), the second insulation layer 520 may include silicon oxide (SiOx). However, the present disclosure is not limited thereto.

As described above, the display device 10 according to the embodiment may include the first electrode 330, the second electrode 340, and the light emitting element 350 disposed between the first electrode 330 and the second electrode 340. The light emitting element 350 may emit light of a specific wavelength band by receiving electrical signals from the first contact electrode 361 and the second contact electrode 362. Here, the light emitting element 350 may be disposed on the first insulation layer 510 disposed between the first electrode 330 and the second electrode 340, and the first contact electrode 361 and the second contact electrode 362 may electrically contact the first electrode 330 and the second electrode 340 through the openings 510P on some areas of the first electrode 330 and the second electrode 340.

Areas of the first insulation layer 510 in which the openings 510P are formed may be spaced apart from the light emitting element 350, and a surface of the first insulation layer 510 which contacts the light emitting element 350 may extend horizontally toward each electrode 330 or 340. Thus, the first insulation layer 510 may smoothly contact the light emitting element 350. Accordingly, the first contact electrode 361 and the second contact electrode 362 may smoothly contact the side surfaces of both ends of the light emitting element 350, and the material of the contact electrodes 360 may be prevented from being broken.

The light emitting element 350 may be manufactured on a substrate by an epitaxial growth method. A seed crystal layer for forming a semiconductor layer may be formed on the substrate, and a desired semiconductor material may be deposited and grown. The structure of light emitting elements 350 according to various embodiments will now be described in detail with reference to FIG. 4.

Figure 4:
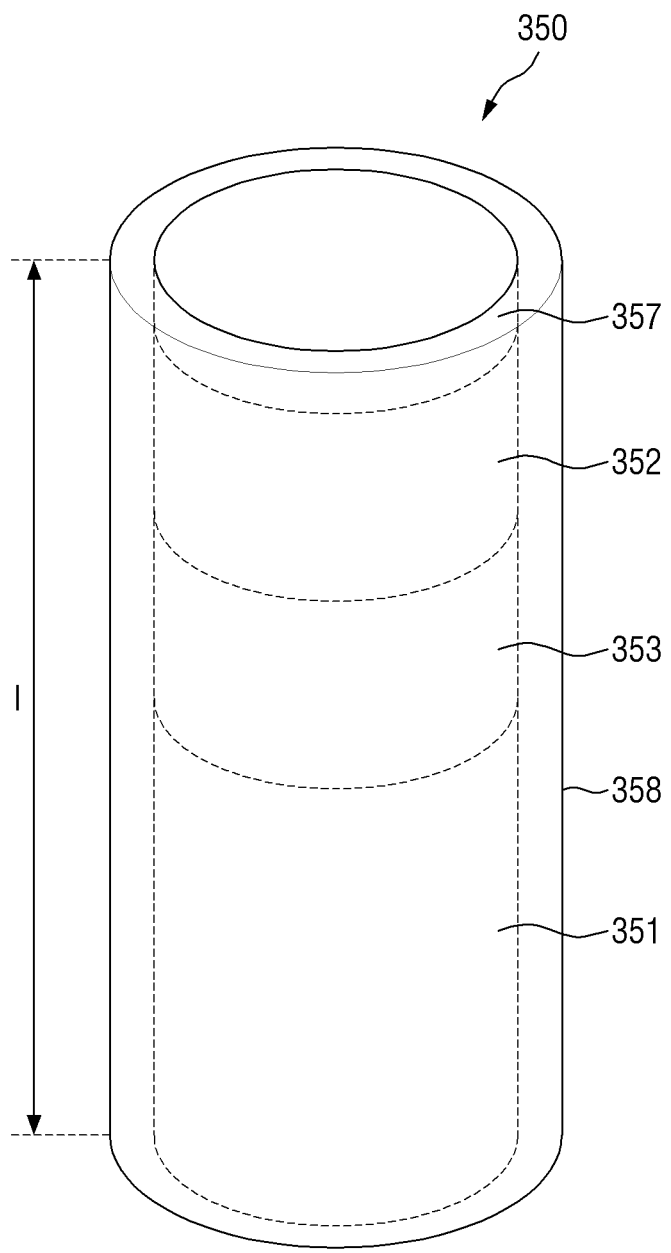
FIG. 4 is a schematic view of a light emitting element according to an embodiment.

FIG. 4 is a schematic view of a light emitting element according to an embodiment.

Referring to FIG. 4, the light emitting element 350 may include conductivity type semiconductor layers 351 and 352, an active material layer 353 disposed between the conductivity type semiconductor layers 351 and 352, an electrode material layer 357, and an insulating material layer 358. Electrical signals applied from a first electrode 330 and a second electrode 340 may be transmitted to the active material layer 353 through the conductivity type semiconductor layers 351 and 352. As a result, light may be emitted.

The light emitting element 350 may include a first conductivity type semiconductor layer 351, a second conductivity type semiconductor layer 352, an active material layer 353 disposed between the first conductivity type semiconductor layer 351 and the second conductivity type semiconductor layer 352, an electrode material layer 357 disposed on the second conductivity type semiconductor layer 352, and an insulating material layer 358. The light emitting element 350 of FIG. 4 has a structure in which the first conductivity type semiconductor layer 351, the active material layer 353, the second conductivity type semiconductor layer 352, and the electrode material layer 357 are sequentially stacked in a longitudinal direction. However, the present disclosure is not limited thereto. The electrode material layer 357 can be omitted and, in some embodiments, may be disposed on at least any one of both side surfaces of each of the first conductivity type semiconductor layer 351 and the second conductivity type semiconductor layer 352. The light emitting element 350 of FIG. 4 will hereinafter be described as an example.

The first conductivity type semiconductor layer 351 may be an n-type semiconductor layer. In an example, in case that the light emitting element 350 emits light in a blue wavelength band, the first conductivity type semiconductor layer 351 may be a semiconductor material having a chemical formula of $In_xAl_yGa_{1-x-y}N$ ($0 \leq x \leq 1$, $0 \leq y \leq 1$, $0 \leq x+y \leq 1$); for example, it may be any one or more of n-type doped InAlGaN, GaN, AlGaN, InGaN, AlN and InN. The first conductivity type semiconductor layer 351 may be doped with a first conductive dopant. The first conductive dopant may be, for example, Si, Ge, or Sn. A length of the first conductivity type semiconductor layer 351 may be in the range of, but not limited to, about 1.5 μm to about 5 μm.

The second conductivity type semiconductor layer 352 may be a p-type semiconductor layer. In an example, in case that the light emitting element 350 emits light in the blue wavelength band, the second conductivity type semiconductor layer 352 may be a semiconductor material having a chemical formula of $In_xAl_yGa_{1-x-y}N$ ($0 \leq x \leq 1$, $0 \leq y \leq 1$, $0 \leq x+y \leq 1$); for example, it may be any one or more of p-type doped InAlGaN, GaN, AlGaN, InGaN, AlN and InN. The second conductivity type semiconductor layer 352 may be doped with a second conductive dopant. The second conductive dopant may be, for example, Mg, Zn, Ca, Se or Ba.

A length of the second conductivity type semiconductor layer 352 may be in the range of, but not limited to, about 0.08 μm to about 0.25 μm.

The active material layer 353 may be disposed between the first conductivity type semiconductor layer 351 and the second conductivity type semiconductor layer 352 and may include a material having a single or multiple quantum well structure. In case that the active material layer 353 includes a material having a multiple quantum well structure, it may have a structure in which quantum layers and well layers are alternately stacked. The active material layer 353 may emit light through combination of electron-hole pairs according to electrical signals received through the first conductivity type semiconductor layer 351 and the second conductivity type semiconductor layer 352. For example, in case that the active material layer 353 emits light in the blue wavelength band, it may include a material such as AlGaN or AlInGaN. In case that the active material layer 353 has a multiple quantum well structure in which quantum layers and well layers are alternately stacked, the quantum layers may include a material such as AlGaN or AlInGaN, and the well layers may include a material such as GaN or AlGaN. However, the present disclosure is not limited thereto, and the active material layer 353 may also have a structure in which a semiconductor material having a large band gap energy and a semiconductor material having a small band gap energy are alternately stacked, or may include different group 3 or 5 semiconductor materials depending on the wavelength band of emitted light. Accordingly, light emitted from the active material layer 353 is not limited to light in the blue wavelength band, but may also be light in red and green wavelength bands in some cases. A length of the active material layer 353 may be in the range of, but not limited to, about 0.05 μm to about 0.25 μm.

Light emitted from the active material layer 353 may travel not only toward an outer surface of the light emitting element 350 in the longitudinal direction but also toward both side surfaces. For example, the direction of the light emitted from the active material layer 353 is not limited to one direction.

The electrode material layer 357 may be an ohmic contact electrode. However, the present disclosure is not limited thereto, and the electrode material layer 357 may also be a Schottky contact electrode. The electrode material layer 357 may include a conductive metal. For example, the electrode material layer 357 may include at least any one of aluminum (Al), titanium (Ti), indium (In), gold (Au), and silver (Ag). Alternatively, the electrode material layer 357 may include the same material or different materials, but the present disclosure is not limited thereto.

The insulating material layer 358 may be formed on the outside of the light emitting element 350 to protect the light emitting element 350. For example, the insulating material layer 358 may be formed to surround sides of the light emitting element 350 and may not be formed at both ends of the light emitting element 350 in the longitudinal direction, for example, at both ends where the first conductivity type semiconductor layer 351 and the second conductivity type semiconductor layer 351 are disposed. The insulating material layer 358 may include an insulating material such as silicon oxide ($SiO_x$), silicon nitride ($SiN_x$), silicon oxynitride ($SiO_xN_y$), aluminum nitride (AlN), or aluminum oxide ($Al_2O_3$). Accordingly, it is possible to prevent an electrical short circuit that may occur in case that the active material layer 353 directly contacts the first electrode 330 or the second electrode 340. Since the insulating material layer 358 protects the outer surface of the light emitting element 350 including the active material layer 353, a reduction in luminous efficiency can be prevented.

The insulating material layer 358 may extend in the longitudinal direction to cover from the first conductivity type semiconductor layer 351 to the electrode material layer 357. However, the present disclosure is not limited thereto, and the insulating material layer 358 may also cover only the first conductivity type semiconductor layer 351, the active material layer 353, and the second conductivity type semiconductor layer 352 or may cover only a portion of an outer surface of the electrode material layer 357 to expose a portion of the outer surface of the electrode material layer 357.

In some embodiments, the insulating material layer 358 may be surface-treated so that it can be kept separate in a solution without being agglomerated with other insulating material layers 358. In case that the light emitting element 350 is aligned as will be described below, it may be kept separate in the solution and aligned between the first electrode 330 and the second electrode 340 without being agglomerated with other light emitting elements 350. For example, the surface of the insulating material layer 358 may be hydrophobic or hydrophilic-treated so that the insulating material layer 358 can be kept separate from other insulating material layers 358 in the solution.

A thickness of the insulating material layer 358 may be in the range of, but not limited to, about 0.5 μm to about 1.5 μm.

The light emitting element 350 may be cylindrical. However, the shape of the light emitting element 350 is not limited to the cylindrical shape, and the light emitting element 350 may also have various shapes such as a cube, a rectangular parallelepiped, and a hexagonal prism. The light emitting element 350 may have a length of about 1 μm to about 10 μm or about 2 μm to about 5 μm, preferably, a length of about 4 μm. In addition, the light emitting element 350 may have a diameter of about 400 nm to about 700 nm, preferably, a thickness of about 500 nm.

A method of manufacturing the display device 10 according to the embodiment will now be described with reference to FIGS. 5 through 17.

FIGS. 5 through 17 are schematic cross-sectional views illustrating a method of manufacturing a display device according to an embodiment.

Figure 5:
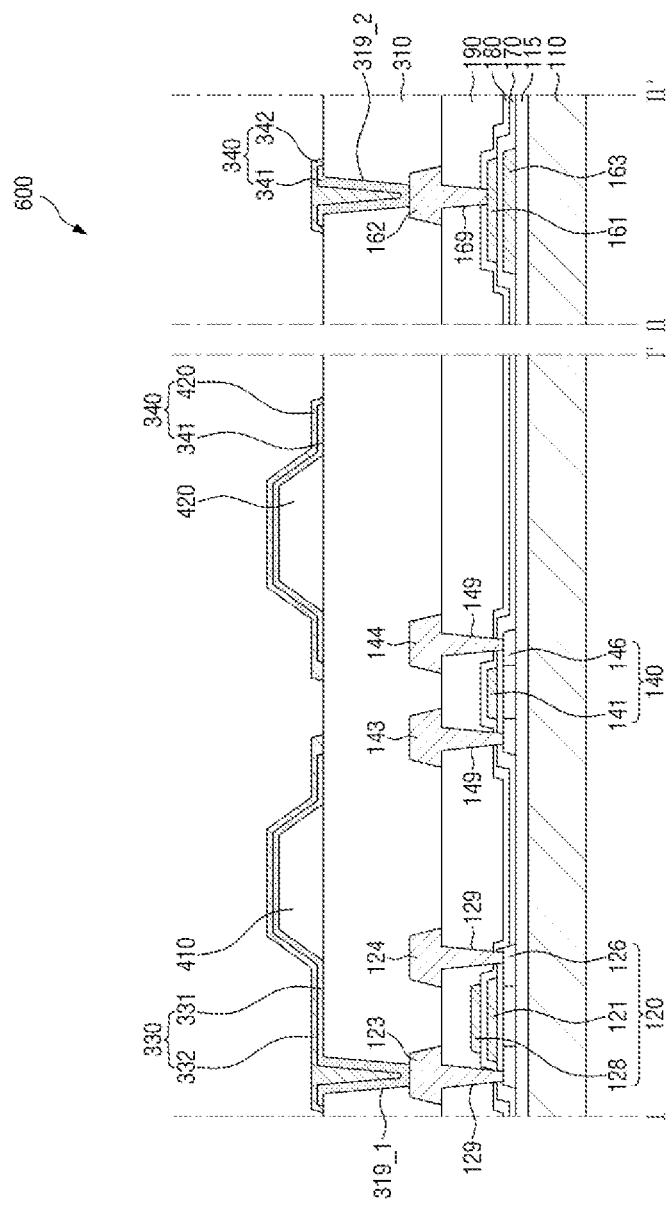
FIGS. 5 through 17 are schematic cross-sectional views illustrating the schematic order of a method of manufacturing a display device according to an embodiment.

Referring to FIG. 5, a first substrate layer 600 including an insulating substrate layer 310, a first barrier rib 410 and a second barrier rib 420 disposed on the insulating substrate layer 310 and spaced apart from each other, and a first electrode 330 and a second electrode 340 respectively disposed on the first barrier rib 410 and the second barrier rib 420 is prepared. The above members may be formed by patterning a metal or an organic material using a conventional mask process. A process of forming each member will be omitted in the following description.

A first thin-film transistor 120, a second thin-film transistor 140, and a power wiring 161 may be disposed under the insulating substrate layer 310 of the first substrate layer 600 as described above. Since the above members are the same as those described above with reference to FIG. 3, a detailed description thereof will be omitted.

Figure 6:
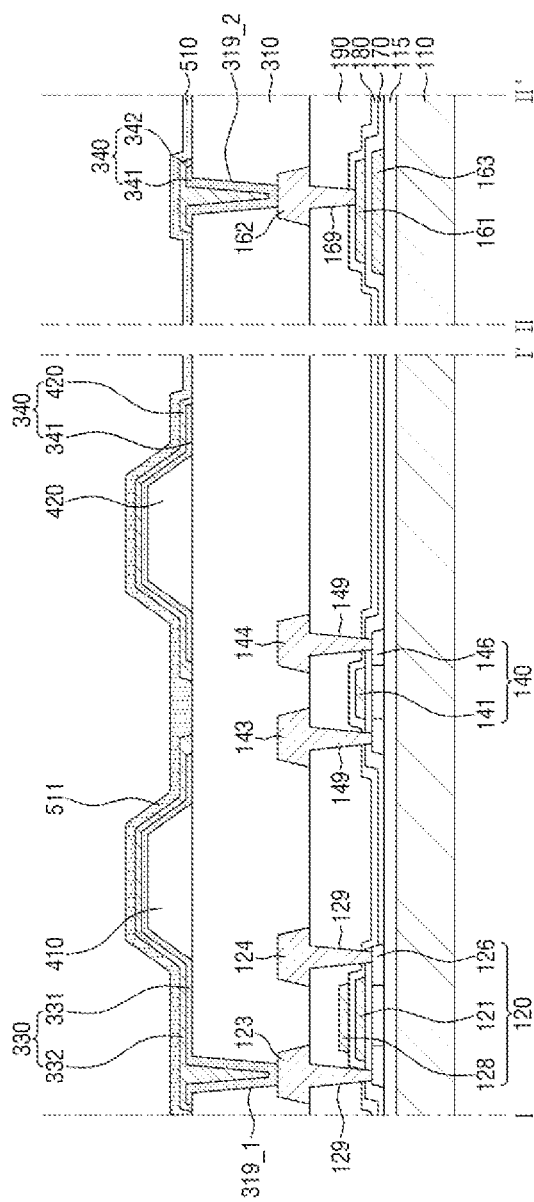

Referring to FIG. 6, a first insulating material layer 511 is formed to cover the first electrode 330 and the second electrode 340. The first insulating material layer 511 may be patterned in a process described below to form a first insulation layer 510 of FIG. 3.

Figure 7:
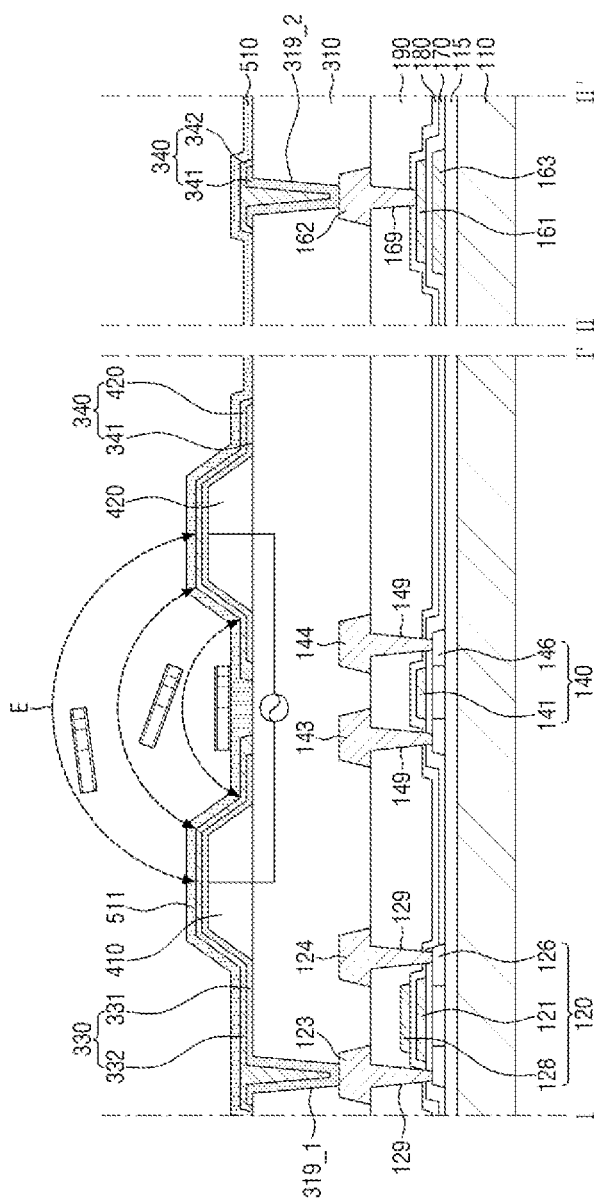

Referring to FIG. 7, a light emitting element 350 is aligned on the first insulating material layer 511 in a space between the first electrode 330 and the second electrode 340. The light emitting element 350 may be aligned using a DEP method.

Although not illustrated in the drawing, a specific method of aligning the light emitting element 350 is as follows. First, a solution containing light emitting elements 350 is applied onto the first electrode 330 and the second electrode 340. The solution may be in the form of ink or paste and may be any one or more of acetone, water, alcohol, and toluene. However, the present disclosure is not limited thereto, and the solution is not particularly limited as long as it is a material that can be vaporized at the room temperature or by heat.

AC power is applied to the first electrode 330 and the second electrode 340, and a capacitance is formed between the first electrode 330 and the second electrode 340 due to an electric field E. In case that the capacitance is formed, a bipolarity is induced in the light emitting element 350 under the non-uniform electric field E, and the light emitting element 350 is subjected to a force by a DEP force. Accordingly, the light emitting element 350 may be aligned between the first electrode 330 and the second electrode 340 by the DEP force. For example, a first end of the light emitting element 350 may electrically contact the first electrode 330, and a second end may electrically contact the second electrode 340.

Figure 8:
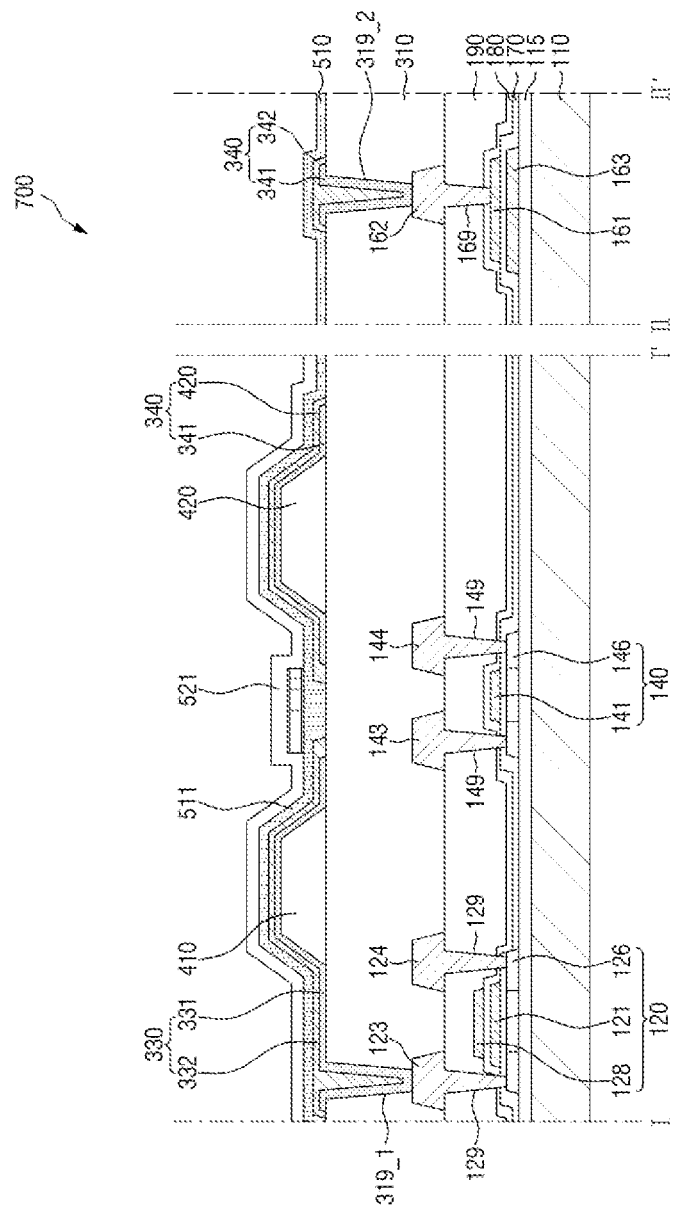

Referring to FIG. 8, a second insulating material layer 521 is formed to cover the first insulating material layer 511 and the light emitting element 350, thereby forming a second substrate layer 700. The second insulating material layer 521 may be disposed on an upper surface of the light emitting element 350 in cross section but may be disposed to substantially cover an outer surface of the light emitting element 350. As described above, the second insulating material layer 521 may include a material having a different etch selectivity from the material of the first insulating material layer 511. The second insulating material layer 521 may be patterned in a process to be described later to form a second insulation layer 520. Here, the first insulating material layer 511 may function as an etching stopper so that only the second insulating material layer 521 is patterned.

Figure 9:
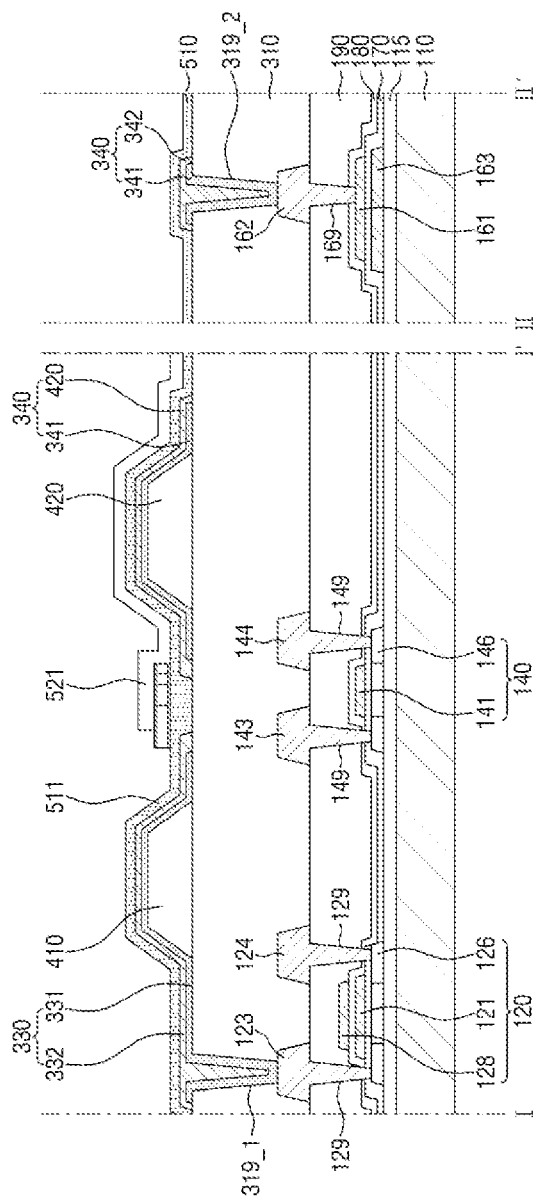

Referring to FIG. 9, the second insulating material layer 521 is patterned to expose a portion of the first insulating material layer 511 on the first electrode 330. When the second insulating material layer 521 is patterned, the first insulating material layer 511 is not etched or damaged. Accordingly, a lower surface contacting the first insulating material layer 511 at the first end of the light emitting element 350 which contacts the first electrode 330 may maintain a smooth contact. A contact surface between the first insulating material layer 511 and the lower surface of the light emitting element 350 may extend horizontally toward the first electrode 330.

Figure 10:
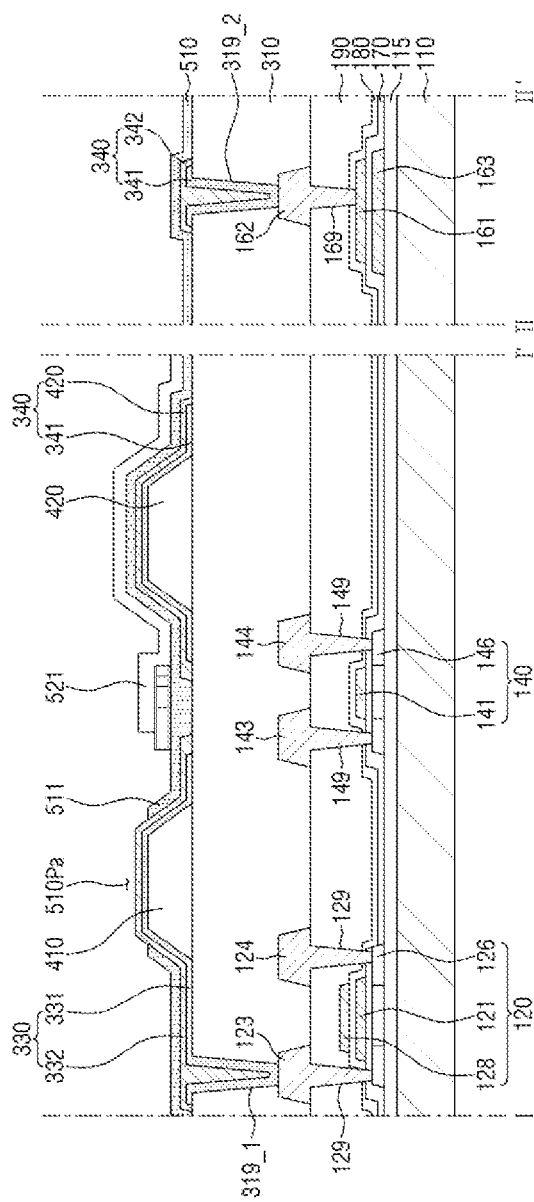

Referring to FIG. 10, the first insulating material layer 511 is patterned to expose a portion of the first electrode 330, thereby forming a first opening 510Pa. The first opening 510Pa may expose the first electrode 330 overlapping a flat upper surface and a portion of inclined surfaces of the first barrier rib 410. Accordingly, the first insulating material layer 511 in an area where the first electrode 330 is disposed may partially overlap the first electrode 330 on the inclined side surfaces of the first barrier rib 410.

Figure 11:
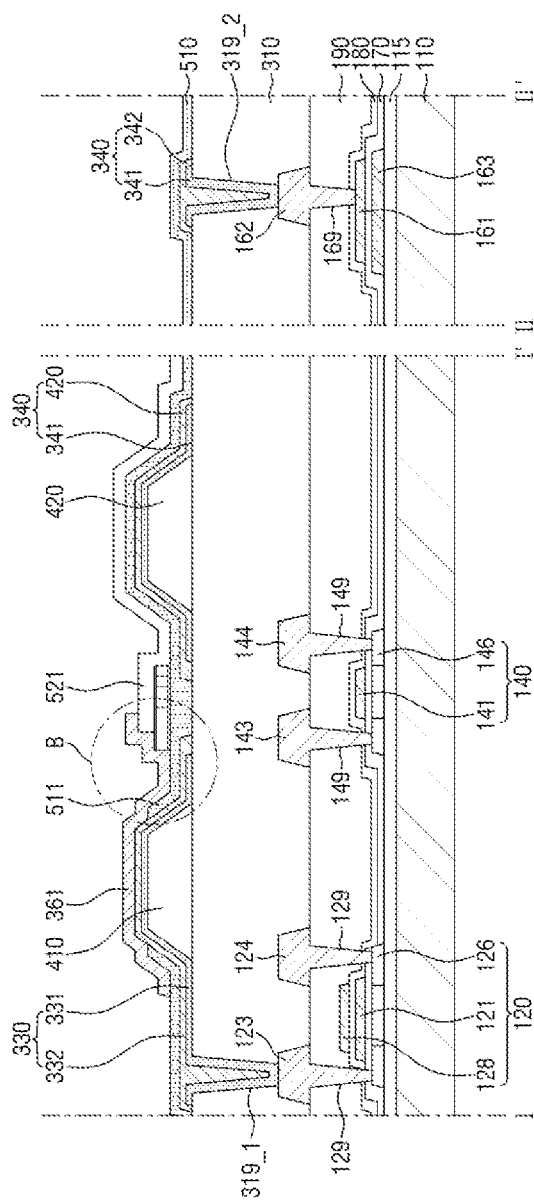

Referring to FIG. 11, a first contact electrode 361 is formed to partially cover the first electrode 330, the first insulating material layer 511 and the second insulating material layer 521 and to contact the first end of the light emitting element 350. The first contact electrode 361 may electrically contact the first electrode 330 exposed in FIG. 12 and may electrically contact a side surface of the first end of the light emitting element 350 which electrically contacts the first electrode 330.

In the patterning of the second insulating material layer 521, since the contact surface between the lower surface of the light emitting element 350 and the first insulating material layer 511 can maintain a smooth surface, the first contact electrode 361 may be smoothly disposed with a portion of an upper surface of the first insulating material layer 511 at the side surface of the first end of the light emitting element 350 without its material being broken. The first contact electrode 361 may electrically contact an end of the patterned second insulating material layer 521.

Figure 12:
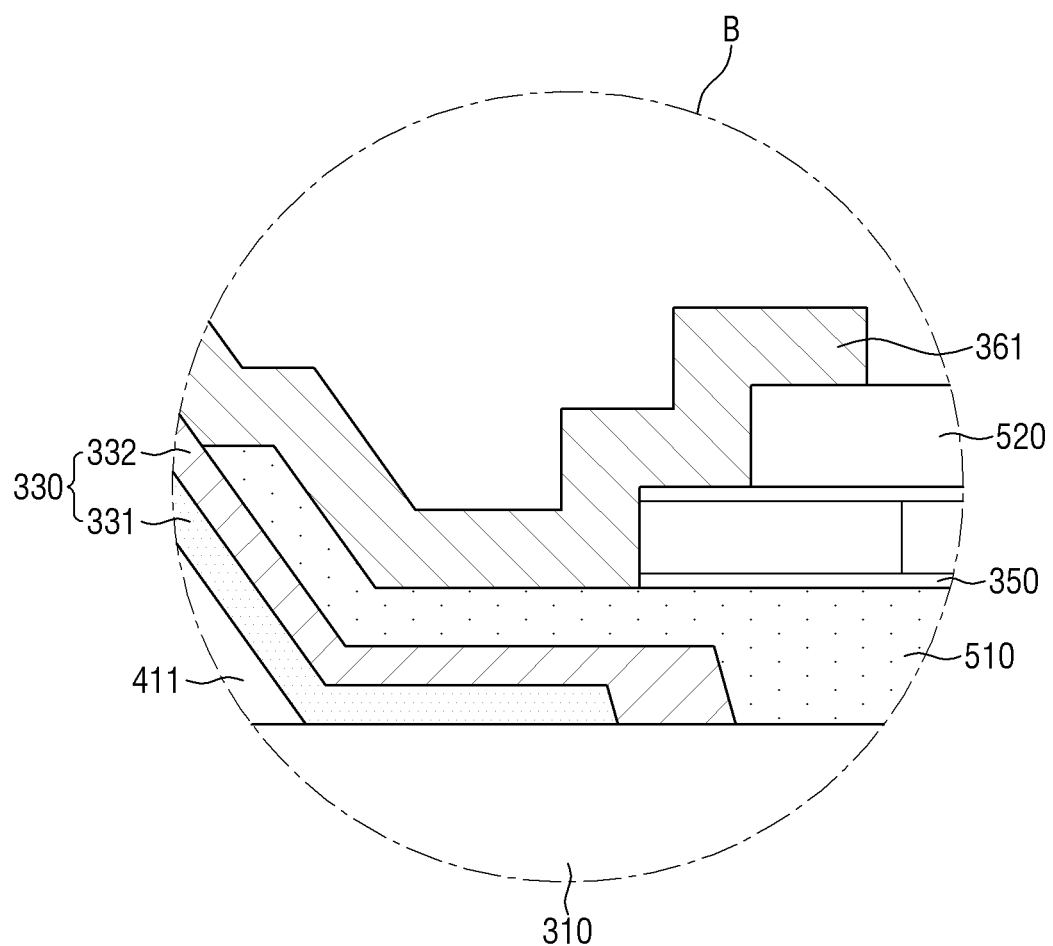
Figure 13:
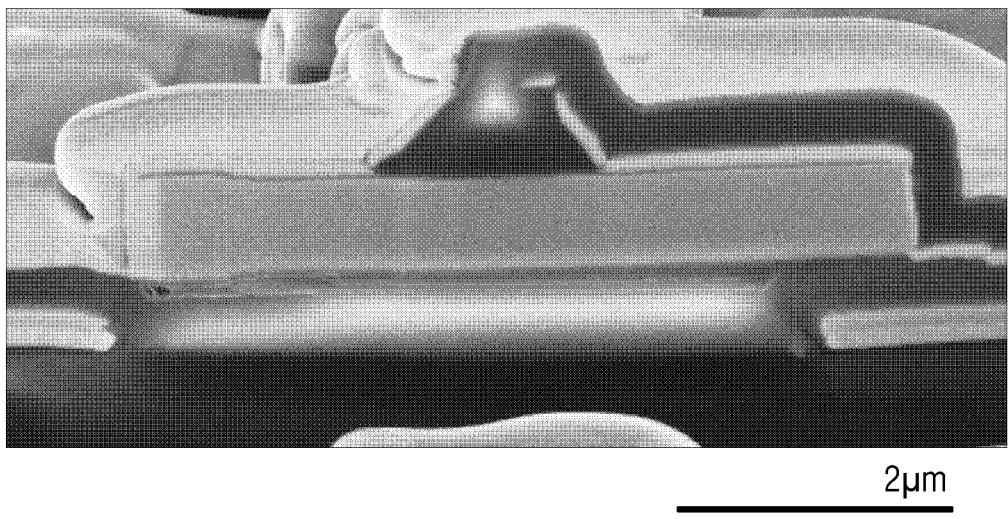

FIG. 12 is an enlarged view of portion B of FIG. 11, and FIG. 13 is an enlarged scanning electron microscope (SEM) photograph of a portion of FIG. 3.

Referring to FIGS. 12 and 13, the material of the first insulating material layer 511 may remain undamaged or unetched at a surface where the light emitting element 350 and the first insulating material layer 511 contact each other. When the second insulating material layer 521 is patterned to expose both ends of the light emitting element 350, the first insulating material layer 511 may function as an etching stopper, and only the second insulating material layer 521 may be etched because the first insulating material layer 511 and the second insulating material layer 521 may have different etch selectivities.

As illustrated in the drawings, the lower surface of the light emitting element 350 and the first insulation layer 510 may maintain a smooth contact surface without damaging or etching of the material. Accordingly, even if contact electrodes 360 including an inorganic material have a poor step coverage, the material of the contact electrodes 360 may not be formed on the lower surface of the light emitting element 350 and may be prevented from being broken by an air gap on the lower surface of the light emitting element 350. Referring to FIG. 13, it can be seen that the contact electrodes 360 smoothly contact the side surfaces of both ends of the light emitting element 350 and an upper surface of the first insulation layer 510 without being broken.

The first contact electrode 361 may electrically contact an area of the first electrode 330 which is exposed by the first opening 510Pa but may not overlap an area where the first electrode 330 contacts the first thin-film transistor 120 through a fourth contact hole 319_1. This has been described in detail above.

Figure 14:
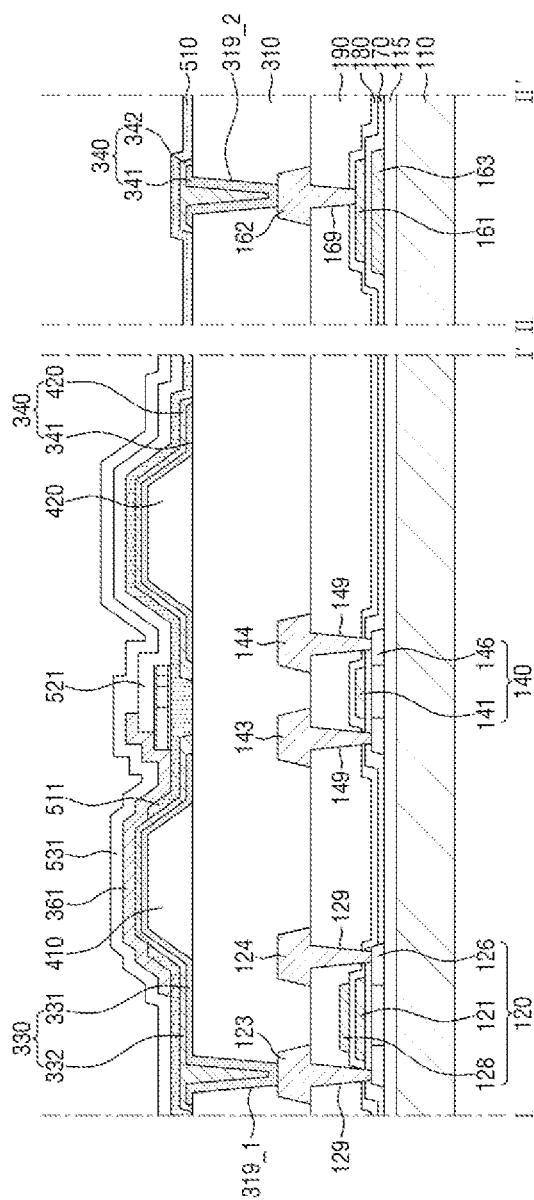

Referring to FIG. 14, a third insulating material layer 531 is formed to cover the first contact electrode 361 and the remaining second insulating material layer 521. The third insulating material layer 531 may also be patterned in a process to be described later to form a third insulation layer 530. The third insulating material layer 531 may include a material having the same etch selectivity as the material of the second insulating material layer 521 so that they can be etched simultaneously. However, the present disclosure is not limited thereto, and the third insulating material layer 531 may also include a material having a different etch selectivity from the material of the second insulating material layer 521.

Figure 15:
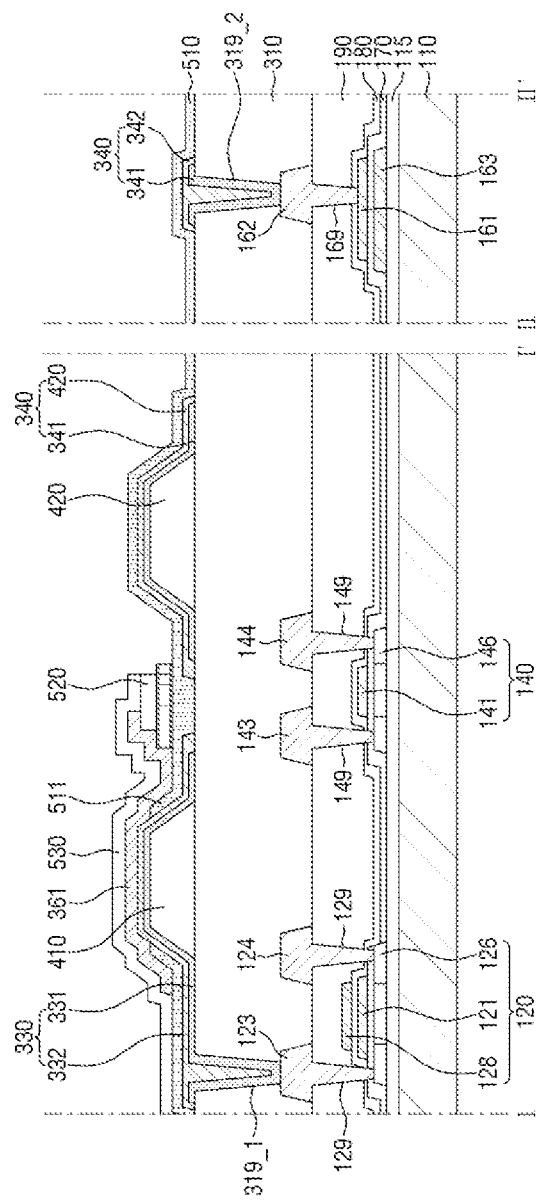

Referring to FIG. 15, the second insulating material layer 521 and the third insulating material layer 531 are patterned to expose a portion of the first insulating material layer 511 on the second electrode 340. As described above, when the second insulating material layer 521 and the third insulating material layer 531 are patterned, the first insulating material layer 511 is not etched or damaged. Accordingly, a lower surface contacting the first insulating material layer 511 at the second end of the light emitting element 350 which electrically contacts the second electrode 340 may maintain a smooth contact. The contact surface between the first insulating material layer 511 and the lower surface of the light emitting element 350 may extend horizontally toward the second electrode 340.

Here, as illustrated in FIG. 15, when the second insulating material layer 521 and the third insulating material layer 531 are patterned simultaneously, their respective end surfaces in a direction in which the second electrode 340 is disposed may be aligned with each other. As areas of the second insulating material layer 521 and the third insulating material layer 531 which overlap the second electrode 340 are patterned, the second insulation layer 520 and the third insulation layer 530 may be formed, respectively.

Figure 16:
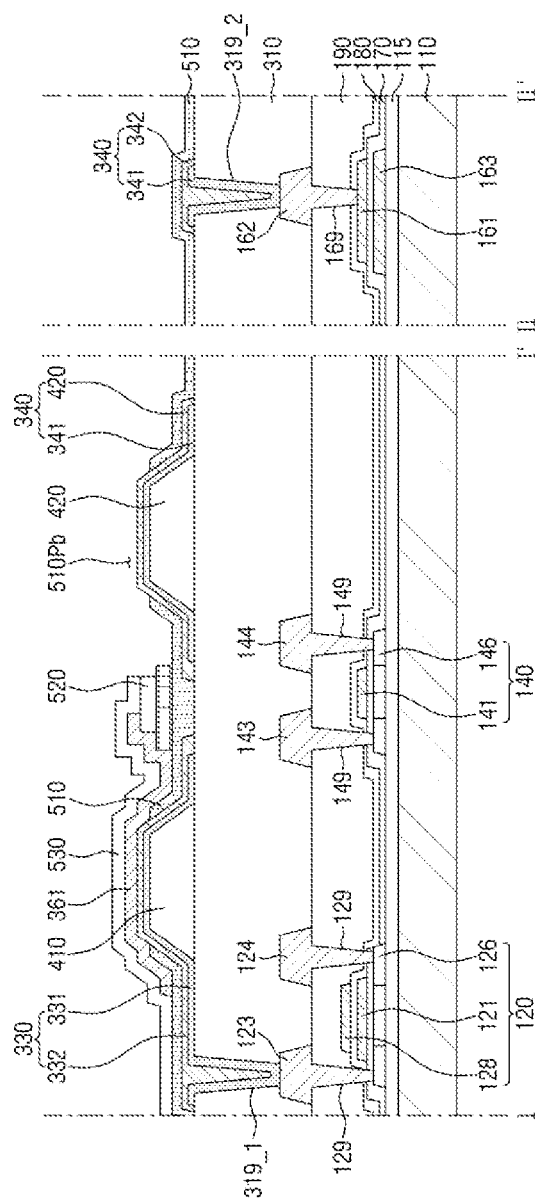

Referring to FIG. 16, the first insulating material layer 511 is patterned to expose a portion of the second electrode 340, thereby forming a second opening 510Pb. The second opening 510Pb may expose the second electrode 340 overlapping a flat upper surface and a portion of inclined surfaces of the second barrier rib 420. Accordingly, the first insulating material layer 511 in an area where the second electrode 340 is disposed may partially overlap the second electrode 340 on the inclined side surfaces of the second barrier rib 420. Here, as the first insulating material layer 511 is patterned, the first insulation layer 510 may be formed.

Figure 17:
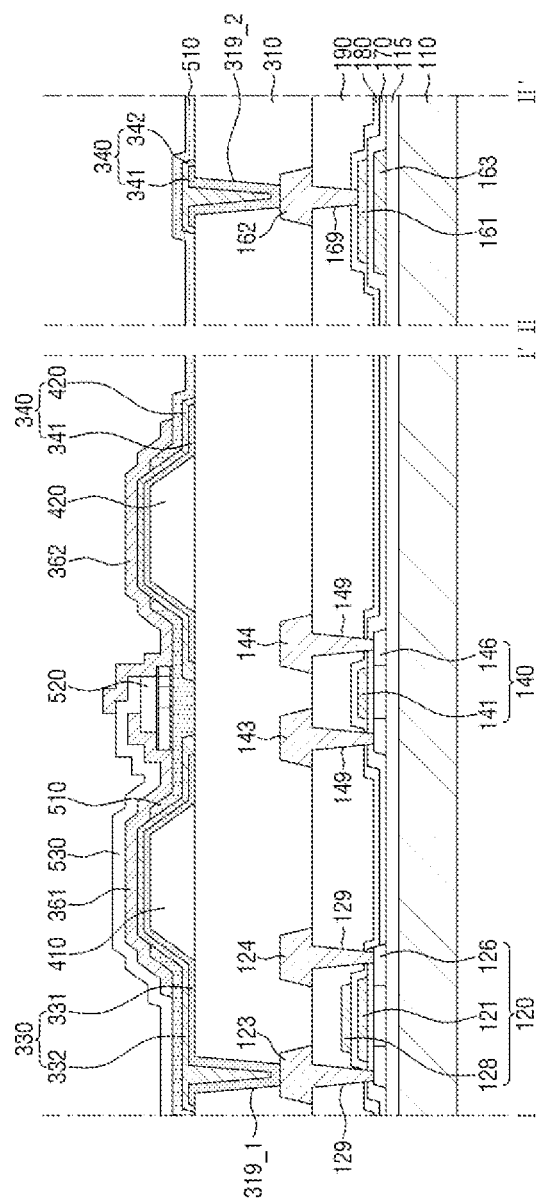

Referring to FIG. 17, a second contact electrode 362 is formed to partially cover the second electrode 340, the first insulation layer 510 and the third insulation layer 530 and to electrically contact the second end of the light emitting element 350 and an end of the second insulation layer 520. The second contact electrode 362 may electrically contact the second electrode 340 exposed in FIG. 16 and electrically contact a side surface of the second end of the light emitting element 350 which electrically contacts the second electrode 340.

In the patterning of the second insulating material layer 521 and the third insulating material layer 531, since the contact surface between the lower surface of the light emitting element 350 and the first insulating material layer 511 can maintain a smooth surface, the second contact electrode 362 may be smoothly disposed with a portion of the upper surface of the first insulating material layer 511 at the side surface of the second end of the light emitting element 350 without its material being broken. The second contact electrode 362 may contact an end of each of the patterned second and third insulation layers 520 and 530.

The second contact electrode 362 may electrically contact an area of the second electrode 340 which is exposed by the second opening 510Pb but may not overlap an area where the second electrode 340 electrically contacts the power wiring 161 through a fifth contact hole 319_2. This has been described in detail above.

Finally, although not illustrated in the drawing, a passivation layer 550 (see, e.g., FIG. 19) may be formed to cover members disposed on the insulating substrate layer 310, thereby completing the display device 10 of FIG. 3.

Hereinafter, display devices 10 according to other embodiments will be described. Differences from the display device 10 of FIG. 1 will be mainly described, and any redundant description will be omitted.

Figure 18:
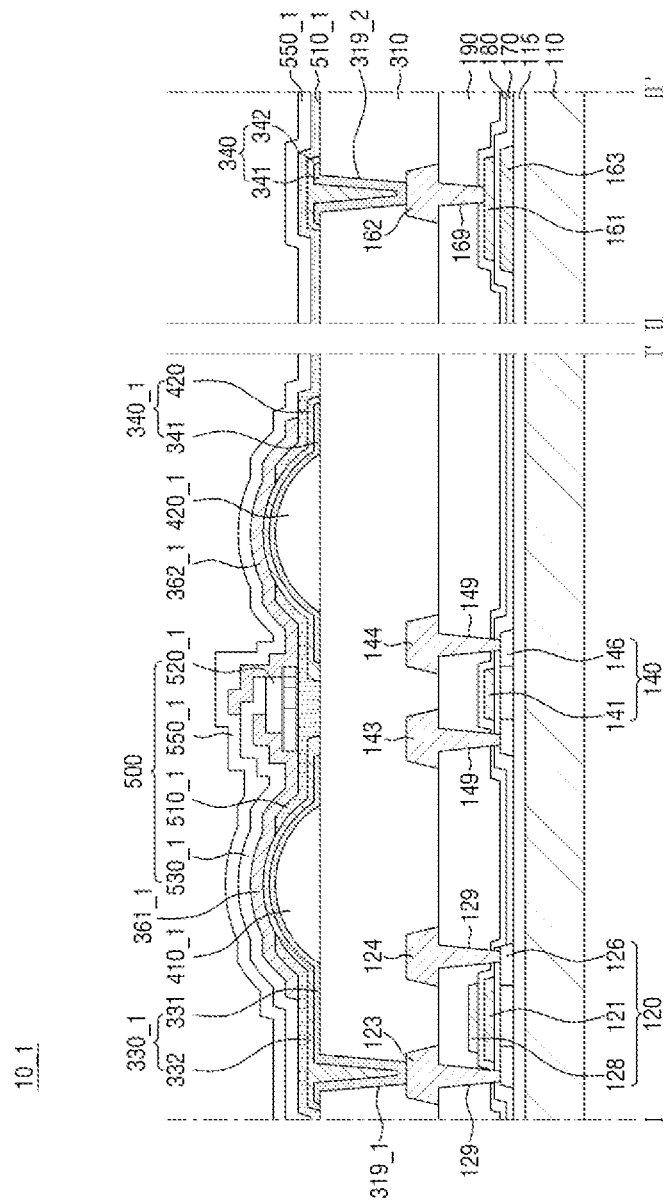
FIGS. 18 and 19 are schematic cross-sectional views of display devices according to a comparative example.
Figure 19:
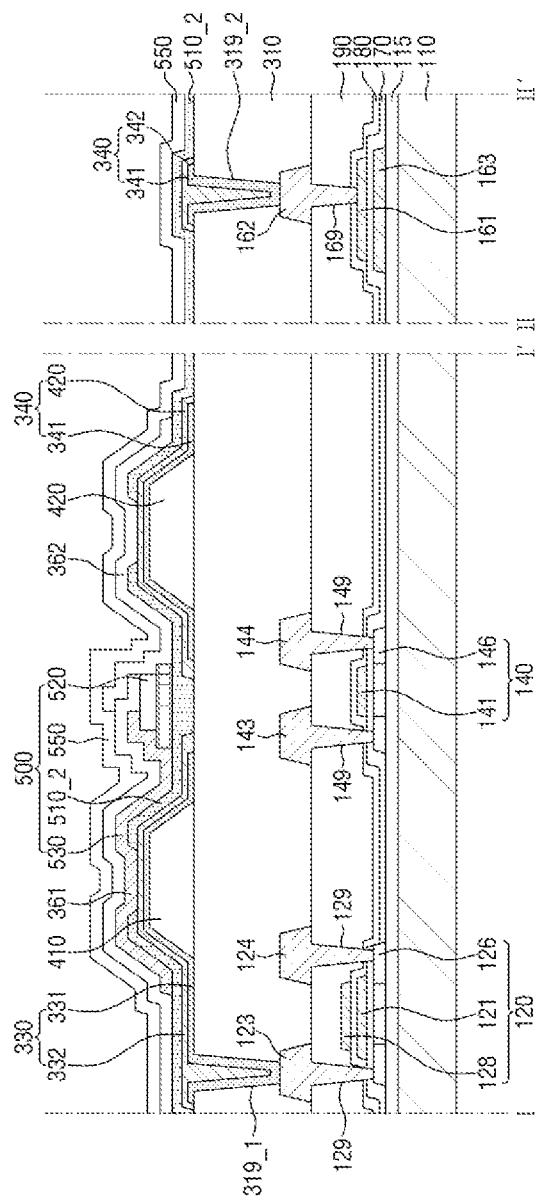

FIGS. 18 and 19 are schematic cross-sectional views of display devices according to other embodiments.

First, referring to FIG. 18, in a display device 10_1, barrier ribs 410_1 and 4201, for example, a first barrier rib 410_1 and a second barrier rib 4201 disposed on an insulating substrate layer 310 may protrude from the insulating substrate layer 310 but may have a curvature unlike in FIG. 3. For example, the first barrier rib 410_1 and the second barrier rib 4201 may be substantially semi-circular or semi-elliptical.

In the display device 10_1 of FIG. 18, since outer surfaces of the first barrier rib 410_1 and the second barrier rib 420_1 are curved, members disposed thereon, for example, a first insulation layer 5101, a first electrode 330_1, and a second electrode 340_1 may be stacked in a curved shape. The above members may be disposed on the first barrier rib 410_1 and the second barrier rib 420_1 to have a curvature in areas overlapping the first barrier rib 410_1 and the second barrier rib 420_1. Reference numerals 331_1, 3321, 3411, 342_1, 361_1, 362_1, 500_1, 520_1, 530_1, and 550_1 indicate elements similar or identical to those of reference numerals 331, 332, 341, 342, 361, 362, 500, 520, 530, and 550, respectively.

Referring to FIG. 19, in a display device 10_2, a first insulation layer 510_2 may also be disposed on level upper surfaces of a first barrier rib 410 and a second barrier rib 420 of a first electrode 330_2 and a second electrode 340_2, and a first contact electrode 361_2 and a second contact electrode 362_2 may electrically contact the first electrode 330_2 and the second electrode 3402 only on the flat upper surfaces of the first barrier rib 410 and the second barrier rib 420. For example, in the display device 10_2 of FIG. 19, openings 510P_2 may be relatively narrow compared with those of FIG. 3.

Accordingly, parts of a first non-overlapping area and a second non-overlapping area in which a lower surface of a light emitting element 350 does not overlap the first insulation layer 510_2 may be located on the first electrode 330_2 and the second electrode 340_2 overlapping the flat upper surfaces of the first barrier rib 410 and the second barrier rib 420.

As described above, the widths of the openings 510P may be adjusted according to the degree of electrical signals transmitted from the first electrode 330 and the second electrode 340 respectively to the first contact electrode 361 and the second contact electrode 362, the type of material of each electrode, and the like. The widths of the openings 510P may be adjusted by controlling the degree to which the first insulating material layer 511 is patterned.

Figure 20:
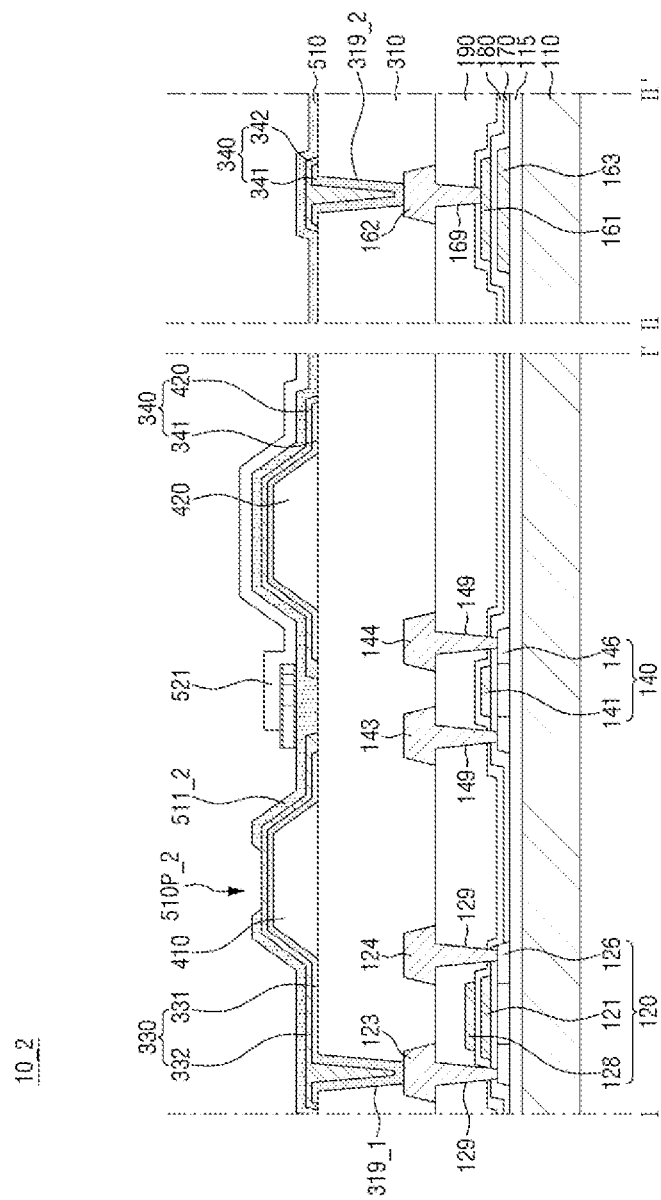
FIG. 20 is a schematic cross-sectional view illustrating a portion of a method of manufacturing the display device of FIG. 19.

FIG. 20 is a cross-sectional view illustrating a portion of a method of manufacturing the display device of FIG. 19.

Referring to FIG. 20, when the first insulating material layer 511_2 is partially patterned to expose a portion of an upper surface of the first electrode 330 or the second electrode 340 during the manufacture of the display device 10_2 of FIG. 19, it may be patterned such that a portion of the first insulating material layer 511_2 also exists on the upper surfaces of the first barrier rib 410 and the second barrier rib 420, unlike in FIGS. 12 and 16. Accordingly, the openings 510P_2 may be disposed only on the flat upper surfaces of the first barrier rib 410 and the second barrier rib 420, and the first contact electrode 361_2 and the second contact electrode 362_2 (see FIG. 19) may electrically contact the first electrode 330 and the second electrode 340 only on the flat upper surfaces of the first barrier rib 410 and the second barrier rib 420. Although only the first electrode 330 is exposed in FIG. 20, it is obvious that the same may apply to the second electrode 340, which therefore will not be described here.

As described above, the third insulation layer 530 of the display device 10 can be omitted. Accordingly, the first contact electrode 361 and the second contact electrode 362 may also be disposed on substantially the same layer.

Figure 21:
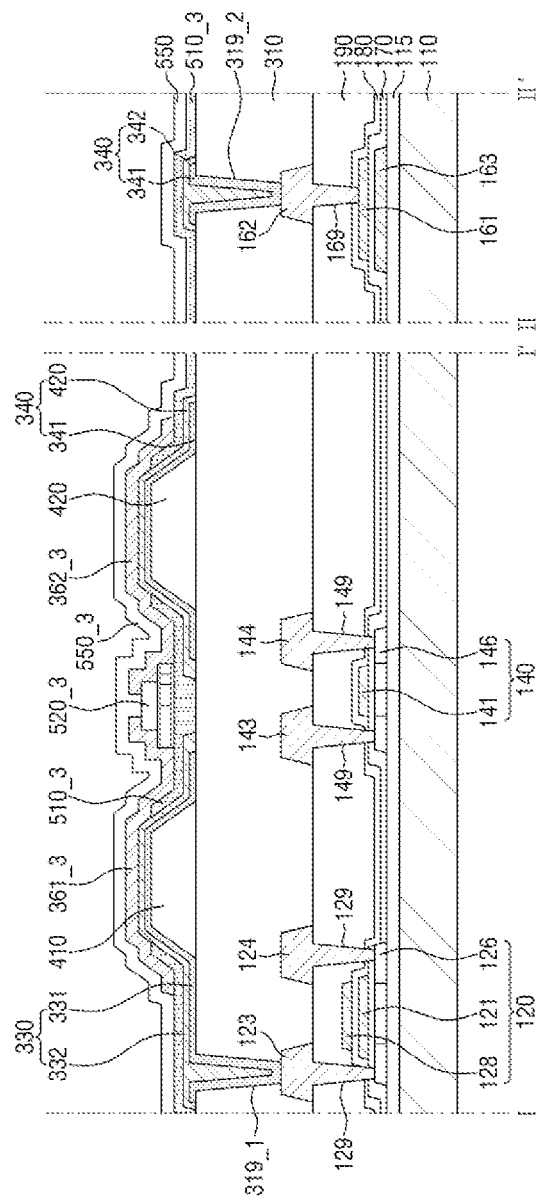
FIG. 21 is a schematic cross-sectional view of a display device according to another embodiment.

FIG. 21 is a cross-sectional view of a display device according to another embodiment.

Referring to FIG. 21, in the display device 103, a third insulation layer 530 may be omitted, and a first contact electrode 361_3 and a second contact electrode 362_3 may be spaced apart from each other on a second insulation layer 520_3 and may lie on substantially the same plane. A passivation layer 550_3 may be disposed in a space between the first contact electrode 361_3 and the second contact electrode 362_3 to electrically insulate the first contact electrode 361_3 and the second contact electrode 362_3 from each other. The display device 10_3 of FIG. 21 may be manufactured by patterning both side surfaces of a second insulating material layer 521 together to simultaneously expose parts of a first insulating material layer 511 which overlap a first electrode 330 and a second electrode 340.

Figure 22:
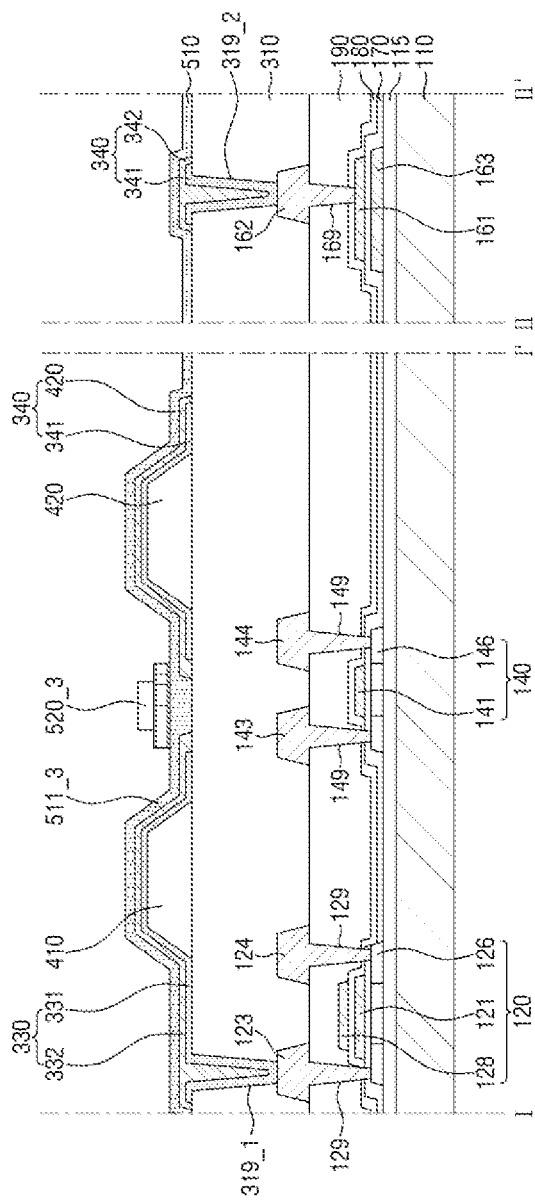
FIGS. 22 through 24 are schematic cross-sectional views illustrating a portion of a method of manufacturing the display device of FIG. 21.
Figure 23:
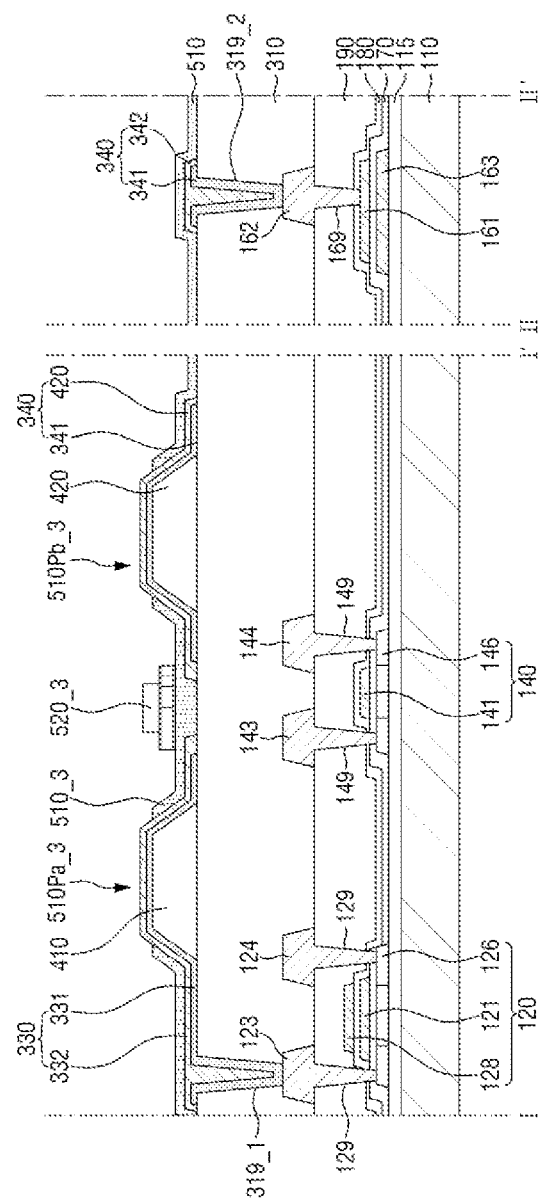
Figure 24:
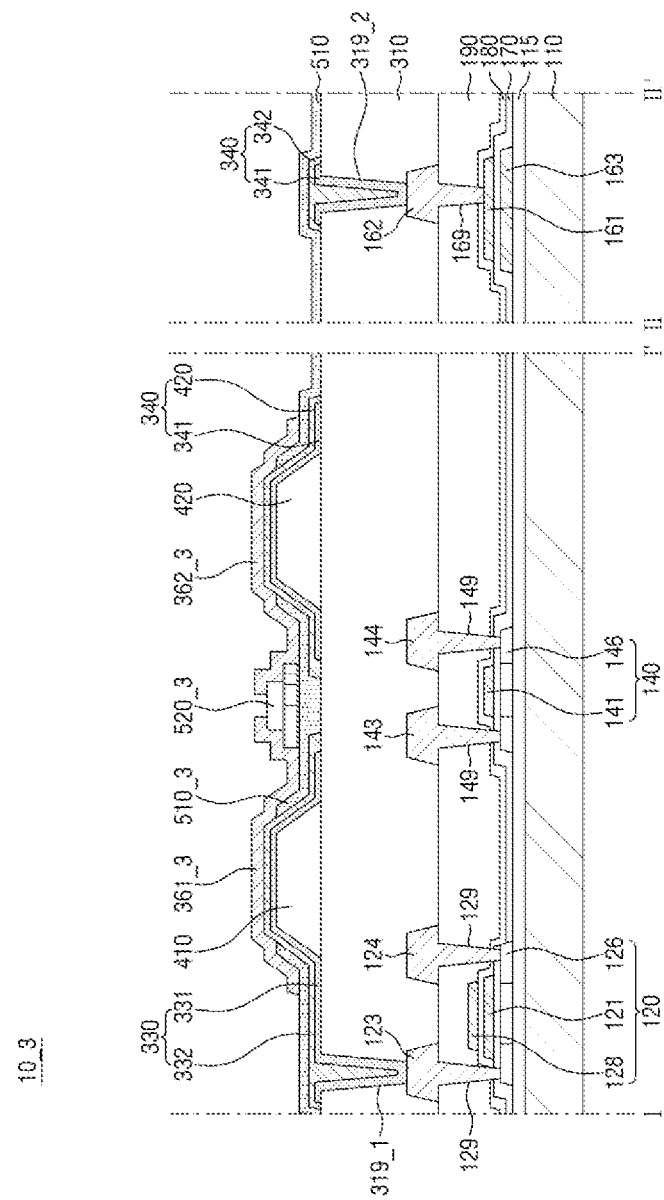

FIGS. 22 through 24 are schematic cross-sectional views illustrating a portion of a method of manufacturing the display device of FIG. 21.

Referring to FIG. 22, in the second substrate layer 700 of FIG. 8, the second insulating material layer 521 is patterned to expose parts of the first insulating material layer 511_3 on the first electrode 330 and the second electrode 340. As described above, when the second insulating material layer 521 is patterned, the first insulating material layer 511_3 may not be etched or damaged, and the second insulating material layer 521 may form the second insulation layer 5203.

Referring to FIG. 23, the first insulating material layer 511_3 is patterned to partially expose the first electrode 330 and the second electrode 340, thereby forming a first opening 520Pa_3 and a second opening 520Pb_3. The first insulating material layer 511_3 may form a first insulation layer 510_3. The disposition and shape of the first opening 520Pa_3 and the second opening 520Pb_3 are the same as those described above. Although the first opening 510Pa_3 and the second opening 510Pb_3 are disposed to overlap flat upper surfaces and a portion of inclined surfaces of a first barrier rib 410 and a second barrier rib 420 in FIG. 23, the present disclosure is not limited thereto. In some cases, they may also be disposed only on the flat upper surfaces of the barrier ribs 410 and 420 as in FIG. 20.

Referring to FIG. 24, the first contact electrode 361_3 and the second contact electrode 362_3 are formed on the first electrode 330 and the second electrode 340 to contact the first electrode 330 and the second electrode 340 through the first opening 510Pa_3 and the second opening 510Pb_3. The first contact electrode 361_3 and the second contact electrode 362_3 may be spaced apart from each other on substantially the same plane. Although not illustrated in the drawing, the first contact electrode 361_3 and the second contact electrode 362_3 may be covered by the passivation layer 550, and the passivation layer 550 also disposed in the space between the first contact electrode 361_3 and the second contact electrode 362_3 may electrically insulate the first contact electrode 361_3 and the second contact electrode 362_3 from each other.

In the display device 10 of FIG. 3, in an area where the light emitting element 350 and the first insulation layer 510 contact each other, an air gap is not formed in the first insulation layer 510, and the first insulation layer 510 contacts the entire lower surface of the light emitting element 350. However, in some embodiments, some air gaps may be formed in the area where the first insulation layer 510 contacts the lower surface of the light emitting element 350 and may be filled with the second insulation layer 520. For example, the second insulation layer 520 may be disposed to cover the outer surface of the light emitting element 350, but at least a portion of the second insulation layer 520 may contact the first insulation layer 510 and the light emitting element 350 at the lower surface of the light emitting element 350.

Figure 25:
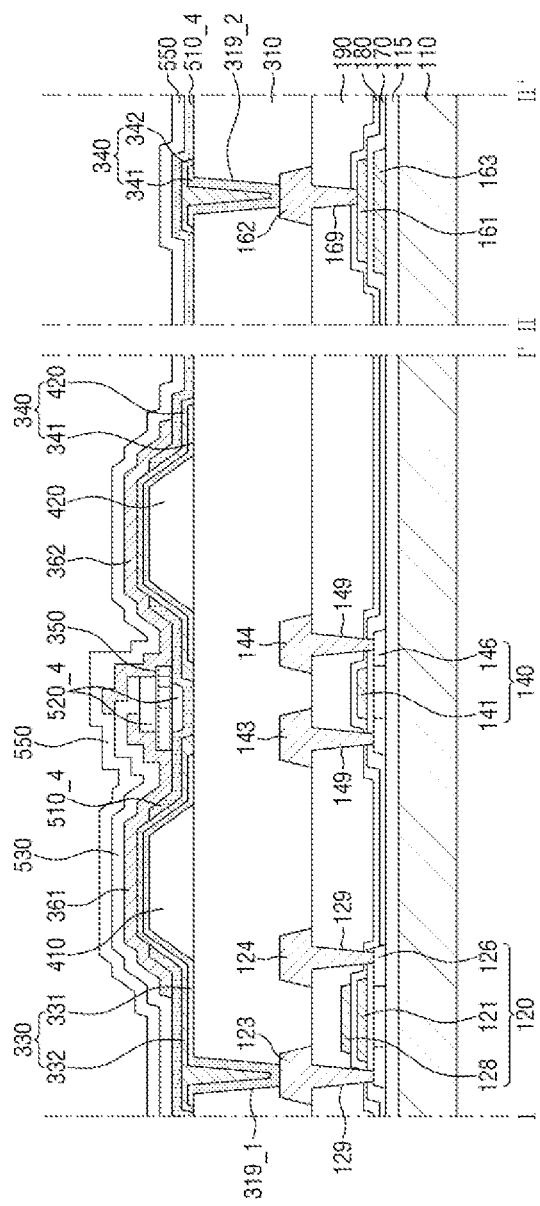
FIG. 25 is a schematic cross-sectional view of a display device according to another embodiment.

FIG. 25 is a schematic cross-sectional view of a display device according to another embodiment.

Referring to FIG. 25, in the display device 10_4, a portion of an area where a light emitting element 350 and a first insulation layer 510_4 contact each other may include the same material as a second insulation layer 520_4.

Of a contact surface between a lower surface of the light emitting element 350 and the first insulation layer 510_4, a surface contacting a central portion of the light emitting element 350 and the second insulation layer 520_4 may contact the same material. As illustrated in the drawing, a portion of the first insulation layer 510_4 may be recessed downward, and the same material as the second insulation layer 520_4 may be disposed in the recessed area. Accordingly, the lower surface of the light emitting element 350 may simultaneously contact the first insulation layer 510_4 and the second insulation layer 520_4.

For this structure of the display device 10_4 of FIG. 25, a portion of the first insulation layer 510_4 may be recessed downward in the drawing, and both ends of the light emitting element 350 may be placed to contact both ends of the recessed portion during the manufacture of the display device 10_4. Here, a portion of the material of the second insulation layer 520_4 disposed to cover the light emitting element 350 may fill the recessed part. Accordingly, the lower surface of the light emitting element 350 may simultaneously contact the first insulation layer 5104 and the second insulation layer 520_4.

Although not illustrated in the drawing, the recessed portion of the first insulation layer 5104 may not necessarily be filled with the material of the second insulation layer 520_4. In some cases, only a portion of the recessed portion may be filled with the material of the second insulation layer 520_4, and the other portion may remain as an air gap. Even in this case, lower surfaces of both ends of the light emitting element 350 may form smooth contact surfaces with the first insulation layer 510_4. The contact surfaces between the lower surfaces of both ends of the light emitting element 350 and the first insulation layer 510_4 may extend horizontally toward electrodes 330 and 340, respectively.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:

1. A display device comprising:
a first electrode;
a second electrode spaced apart from the first electrode to face the first electrode;
a first insulation layer disposed on the first electrode and the second electrode to expose at least a portion of each of the first electrode and the second electrode and to cover at least a portion of respective facing sides of the first electrode and the second electrode and a space between the first electrode and the second electrode;
at least one light emitting element disposed on the first insulation layer between the first electrode and the second electrode;
a second insulation layer disposed between the first electrode and the second electrode to cover at least a portion of the at least one light emitting element;
a first contact electrode electrically contacting the first electrode and a first end of the at least one light emitting element; and
a second contact electrode electrically contacting the second electrode and a second end of the at least one light emitting element,
wherein the first insulation layer comprises:
an overlapping area overlapping the at least one light emitting element;
a first non-overlapping area extending outward from the first end of the at east one light emitting element and not overlapping the at least one light emitting element; and
a second non-overlapping area extending outward from the second end of the at least one light emitting element and not overlapping the at least one light emitting element.

2. The display device of claim 1, wherein the first insulation layer partially covers the first electrode and the second electrode and comprises;
a first opening partially exposing the first electrode; and
a second opening partially exposing the second electrode.

3. The display device of claim 2, wherein a material of the first insulation layer and a material of the second insulation layer have different etch selectivities.

4. The display device of claim 3, wherein the first insulation layer partially covers sides opposite the respective facing sides of the first electrode and the second electrode.

5. The display device of claim 2, wherein the overlapping area of the first insulation layer is substantially level with at least a portion of each of the first non-overlapping area and the second non-overlapping area.

6. The display device of claim 5, wherein
the respective facing sides of the first electrode and the second electrode are inclined with respect to a substrate disposed under the first electrode and the second electrode,
at least a portion of the first non-overlapping area partially overlaps the inclined side of the first electrode, and
at least a portion of the second non-overlapping area partially overlaps the inclined side of the second electrode.

7. The display device of claim 6, wherein
the first non-overlapping area partially covers an upper surface of the first electrode, and
the second non-overlapping area partially covers an upper surface of the second electrode.

8. The display device of claim 2, wherein
at least one of the first opening and the second opening extends in a first direction in which the first electrode and the second electrode extend, and
the first opening and the second opening are spaced apart from each other in a second direction different from the first direction.

9. The display device of claim 8, wherein both ends of each of the first opening and the second opening in the first direction end at positions spaced apart inwardly from both ends of the first electrode or the second electrode in the first direction.

10. The display device of claim 9, wherein
a width of the first opening and a width of the second opening measured in the second direction are smaller than a width of the first electrode and a width of the second electrode measured in the second direction, respectively, and
a distance between the respective facing sides of the first electrode and the second electrode is smaller than a distance between respective facing sides of the first opening and the second opening.

11. The display device of claim 10, wherein a length between the first end and the second end of the at least one light emitting element is greater than the distance between the respective facing sides of the first electrode and the second electrode and smaller than the distance between the respective facing sides of the first opening and the second opening.

12. The display device of claim 2, wherein
the first contact electrode electrically contacts the first electrode through the first opening,
the second contact electrode electrically contacts the second electrode through the second opening, and
at least a portion of each of the first contact electrode and the second contact electrode contacts the first insulation layer.

13. The display device of claim 12, wherein
a side surface of the first end of the at least one light emitting element electrically contacts the first contact electrode,
a side surface of the second end of the at least one light emitting element electrically contacts the second contact electrode, and
lower surfaces of the first end and the second end of the at leas one light emitting element partially contact the overlapping area of the first insulation layer.

14. The display device of claim 2, further comprising a third insulation layer disposed on the first electrode, the first contact electrode, and the second insulation layer to partially cover the first electrode, the first contact electrode and the second insulation layer,
wherein the second contact electrode contacts at least a portion of each of the third insulation layer, the second electrode, and the second insulation layer.

* * * * *